United States Patent
Murakami et al.

(10) Patent No.: US 10,644,068 B2
(45) Date of Patent: May 5, 2020

(54) MEMORY DEVICE

(71) Applicant: TOSHIBA MEMORY CORPORATION, Minato-ku (JP)

(72) Inventors: Toshiya Murakami, Yokkaichi (JP); Akihiro Kajita, Yokkaichi (JP); Masumi Saitoh, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/299,660

(22) Filed: Mar. 12, 2019

(65) Prior Publication Data
US 2020/0027923 A1    Jan. 23, 2020

(30) Foreign Application Priority Data
Jul. 20, 2018   (JP) .................................. 2018-137142

(51) Int. Cl.
*H01L 27/24* (2006.01)
*H01L 45/00* (2006.01)

(52) U.S. Cl.
CPC ...... *H01L 27/2463* (2013.01); *H01L 45/1233* (2013.01); *H01L 45/144* (2013.01); *H01L 45/1616* (2013.01)

(58) Field of Classification Search
CPC ............. H01L 45/1233; H01L 45/1253; H01L 27/2463
See application file for complete search history.

(56) References Cited

U.S. PATENT DOCUMENTS 7,394,088 B2    7/2008   Lung
7,601,995 B2 *  10/2009  Happ .................. H01L 27/2436
                                              257/192

(Continued)

FOREIGN PATENT DOCUMENTS

JP     2008-288565    11/2008
JP     2013-045892     3/2013

OTHER PUBLICATIONS

Chiyui Ahn, et al., "Energy-Efficient Phase-Change Memory with Graphene as a Thermal Barrier", Nano Letters 15, 2015, 6 pages.

(Continued)

*Primary Examiner* — Allison Bernstein
(74) *Attorney, Agent, or Firm* — Oblon, McClelland, Maier & Neustadt, L.L.P.

(57) ABSTRACT

According to one embodiment, a memory device includes first and second electrically conductive portions, a first variable resistance portion, and a first region. A direction from the first electrically conductive portion toward the second electrically conductive portion is aligned with a first direction. The first variable resistance portion is provided between the first and second electrically conductive portions. A second direction from the first variable resistance portion toward the first region crosses the first direction. The first region includes a first layer portion, and a second layer portion provided between the first layer portion and the first variable resistance portion in the second direction. A first distance between the first and second layer portions is longer than first or second lattice length. The first lattice length is a lattice length of the first layer portion. The second lattice length is a lattice length of the second layer portion.

10 Claims, 14 Drawing Sheets

(56) References Cited

U.S. PATENT DOCUMENTS

| | | | |
|---|---|---|---|
| 7,995,382 B2 * | 8/2011 | Tsukamoto | B82Y 10/00 |
| | | | 365/148 |
| 8,507,887 B2 * | 8/2013 | Sonehara | H01L 27/224 |
| | | | 257/2 |
| 8,916,973 B1 | 12/2014 | Kim et al. | |
| 9,153,777 B2 | 10/2015 | Boniardi et al. | |
| 9,536,840 B2 | 1/2017 | Du | |
| 9,634,245 B2 | 4/2017 | Gotti et al. | |
| 2008/0283812 A1 | 11/2008 | Liu | |

OTHER PUBLICATIONS

M. Harb, et al., "The c-axis thermal conductivity of graphite film of nanometer thickness measured by time resolved X-ray diffraction", Applied Physics Letters 101, 2012, 5 pages.

\* cited by examiner

US 10,644,068 B2

MEMORY DEVICE

CROSS-REFERENCE TO RELATED APPLICATIONS

This application is based upon and claims the benefit of priority from Japanese Patent Application No. 2018-137142, filed on Jul. 20, 2018; the entire contents of which are incorporated herein by reference.

FIELD

Embodiments described herein relate generally to a memory device.

BACKGROUND

For example, there is a memory device that uses a variable resistance layer. Stable operations of the memory device are desirable.

DETAILED DESCRIPTION

Figure 1A:
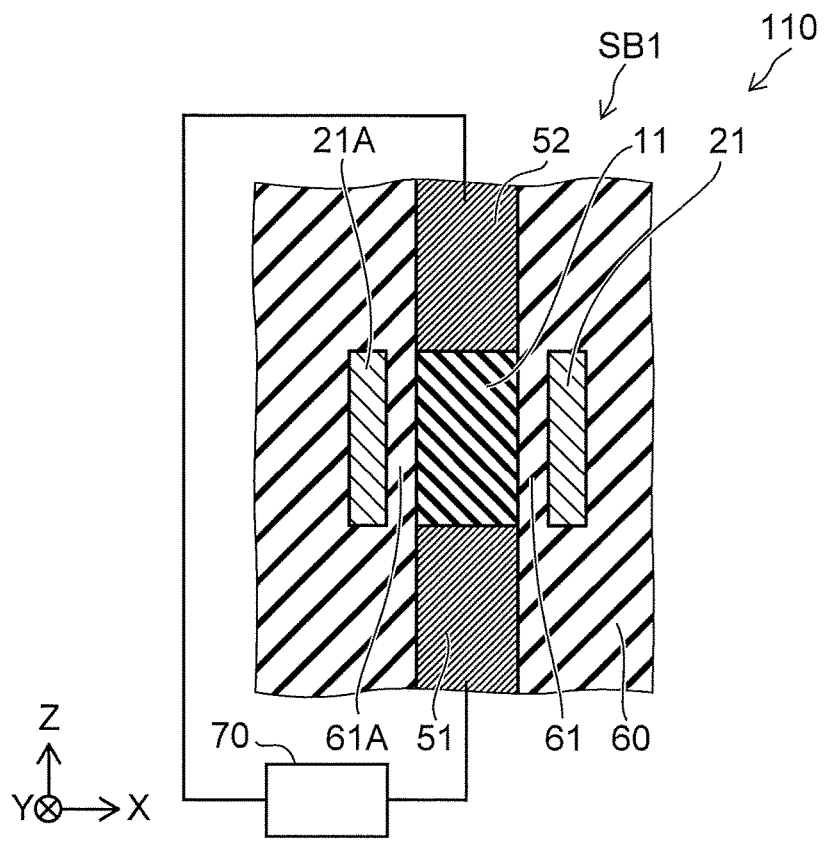
FIG. 1A to FIG. 1C are schematic cross-sectional views illustrating a memory device according to a first embodiment.

According to one embodiment, a memory device includes a first electrically conductive portion, a second electrically conductive portion, a first variable resistance portion, and a first region. A direction from the first electrically conductive portion toward the second electrically conductive portion is aligned with a first direction. The first variable resistance portion is provided between the first electrically conductive portion and the second electrically conductive portion. A second direction from the first variable resistance portion toward the first region crosses the first direction. The first region includes a first layer portion, and a second layer portion provided between the first layer portion and the first variable resistance portion in the second direction. A first distance along the second direction between the first layer portion and the second layer portion is longer than at least one of a first lattice length or a second lattice length. The first lattice length is a lattice length of the first layer portion along a first axis direction crossing the second direction. The second lattice length is a lattice length of the second layer portion along a second axis direction crossing the second direction.

According to another embodiment, a memory device includes a first electrically conductive portion, a second electrically conductive portion, a first variable resistance portion, a first region, and an insulating portion. A direction from the first electrically conductive portion toward the second electrically conductive portion is aligned with a first direction. The first variable resistance portion is provided between the first electrically conductive portion and the second electrically conductive portion. A second direction from the first variable resistance portion toward the first region crosses the first direction. The insulating portion includes a first insulating region provided between the first variable resistance portion and the first region in the second direction. The first region includes a first graphene. The second direction crosses a layer plane of the first graphene.

According to another embodiment, a memory device includes a first electrically conductive portion, a second electrically conductive portion, a first variable resistance portion, and a first region. A direction from the first electrically conductive portion toward the second electrically conductive portion is aligned with a first direction. The first variable resistance portion is provided between the first electrically conductive portion and the second electrically conductive portion. A second direction from the first variable resistance portion toward the first region crosses the first direction. The first region includes a first layer portion, and a second layer portion provided between the first layer portion and the first variable resistance portion in the second direction. A first distance along the second direction between the first layer portion and the second layer portion is longer than at least one of a second distance or a third distance. The second distance is a distance between one of a plurality of first atoms included in the first layer portion and an other one of the plurality of first atoms adjacent to the one of the plurality of first atoms. The third distance is a distance between one of a plurality of second atoms included in the second layer portion and an other one of the plurality of second atoms adjacent to the one of the plurality of second atoms.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
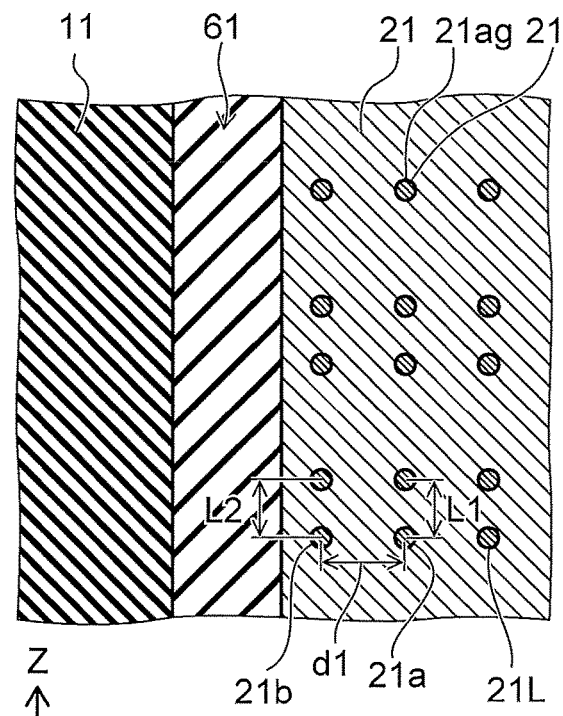
Figure 1C:
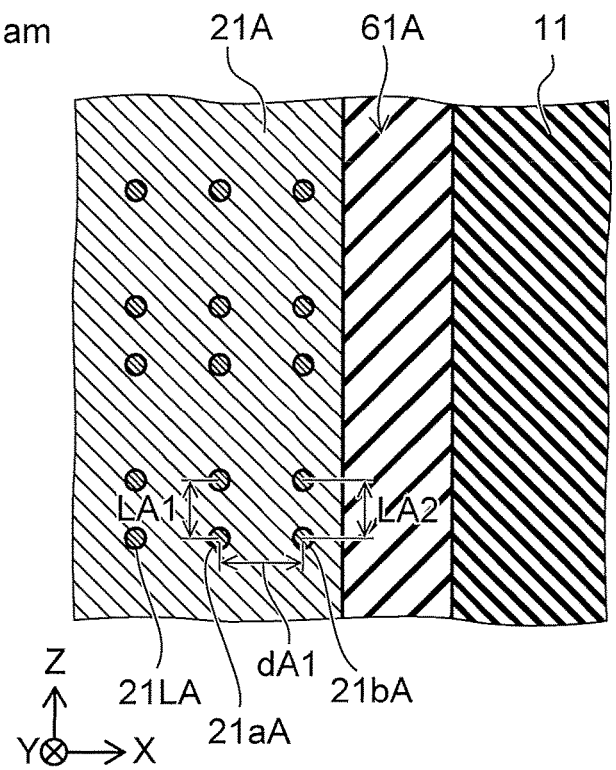

FIG. 1A to FIG. 1C are schematic cross-sectional views illustrating a memory device according to a first embodiment.

FIG. 1B and FIG. 1C schematically illustrate an enlargement of a portion of FIG. 1A.

As shown in FIG. 1A, the memory device 110 according to the embodiment includes a first electrically conductive portion 51, a second electrically conductive portion 52, a first variable resistance portion 11, a first region 21, and an insulating portion 60.

The direction from the first electrically conductive portion 51 toward the second electrically conductive portion 52 is aligned with a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The first variable resistance portion 11 is provided between the first electrically conductive portion 51 and the second electrically conductive portion 52. The first variable resistance portion 11 is electrically connected to the first electrically conductive portion 51 and the second electrically conductive portion 52. In the example, the first variable resistance portion 11 contacts the first electrically conductive portion 51 and the second electrically conductive portion 52. In the embodiment, another layer may be provided between the first variable resistance portion 11 and the first electrically conductive portion 51. Another layer may be provided between the first variable resistance portion 11 and the second electrically conductive portion 52.

As shown in FIG. 1A, a controller 70 may be electrically connected to the first electrically conductive portion 51 and the second electrically conductive portion 52. For example, a voltage (e.g., a pulse voltage) is applied between the first electrically conductive portion 51 and the second electrically conductive portion 52 by the controller 70. For example, the electrical resistance of the first variable resistance portion 11 changes according to the conditions of the voltage. Multiple states that have different electrical resistances correspond to information to be stored.

For example, the phase state of the first variable resistance portion 11 may change according to the conditions of the voltage. For example, a first state is formed in the first variable resistance portion 11 when a first pulse voltage is applied. A second state is formed in the first variable resistance portion 11 when a second pulse voltage is applied. For example, the pulse length of the first pulse voltage is shorter than the pulse length of the second pulse voltage. For example, the pulse height of the first pulse voltage is lower than the pulse height of the second pulse voltage. In such a case, for example, the crystallinity in the second state is lower than the crystallinity in the first state. For example, the first state may be substantially amorphous. For example, the temperature of the first variable resistance portion 11 is increased by an application of a pulse voltage; and the temperature subsequently decreases. The first state or the second state recited above is generated according to the conditions of the temperature change.

In one example, the first variable resistance portion 11 includes a chalcogenide compound. The first variable resistance portion 11 includes, for example, a Ge—Sb—Te-based chalcogenide compound (GST). For example, the first variable resistance portion 11 may include $Ge_2Sb_2Te_5$. Examples of other materials of the first variable resistance portion 11 are described below.

At least one of the first electrically conductive portion 51 or the second electrically conductive portion 52 includes a metal (e.g., tungsten, etc.). Examples of other materials of these electrically conductive portions are described below.

For example, the first variable resistance portion 11 functions as one memory cell. At least one of the first electrically conductive portion 51 or the second electrically conductive portion 52 may be included in the memory cell. The first variable resistance portion 11 is included in a first stacked body SB1. At least one of the first electrically conductive portion 51 or the second electrically conductive portion 52 may be included in the first stacked body SB1. As described below, multiple stacked bodies may be provided.

The controller 70 may be included in the memory device (or the memory apparatus) according to the embodiment.

As described above, the first region 21 is provided in the memory device 110. A second direction from the first variable resistance portion 11 toward the first region 21 crosses the first direction (the Z-axis direction). In the example, the second direction corresponds to the X-axis direction.

The insulating portion 60 includes a first insulating region 61. The first insulating region 61 is provided between the first variable resistance portion 11 and the first region 21 in the second direction (e.g., the X-axis direction).

The insulating portion 60 includes, for example, silicon oxide, etc. Other examples of the material of the insulating portion 60 are described below.

As shown in FIG. 1B, the first region 21 includes a first layer portion 21a and a second layer portion 21b. The second layer portion 21b is provided between the first layer portion 21a and the first variable resistance portion 11 in the second direction (e.g., the X-axis direction). Thus, the first region 21 includes multiple layer portions 21L. Two mutually-adjacent layer portions of the multiple layer portions 21L correspond to the first layer portion 21a and the second layer portion 21b.

At least a portion of each of these layer portions 21L includes a crystal region. The first layer portion 21a has a first lattice length L1 along a first axis direction crossing the second direction (e.g., the X-axis direction). In one example, for example, the first axis direction is along the Z-Y plane. The second layer portion 21b has a second lattice length L2 along a second axis direction crossing the second direction (the X-axis direction). In one example, for example, the second axis direction is along the Z-Y plane. The first axis direction may be substantially parallel to the second axis direction or may cross the second axis direction. For example, the first axis direction and the second axis direction may include Z-axis direction components. The lattice length is, for example, the lattice constant. The lattice length is the distance between two lattice points. The second lattice length L2 may be the same as the first lattice length L1.

A first distance d1 along the second direction (the X-axis direction) between the first layer portion 21a and the second layer portion 21b is longer than the first lattice length L1 of the first layer portion 21a. The first distance d1 is longer than the second lattice length L2 of the second layer portion 21b. The first distance d1 recited above corresponds to the distance along the second direction (the X-axis direction) between the position along the second direction (the X-axis direction) of one lattice included in the first layer portion 21a and the position along the second direction (the X-axis direction) of one lattice included in the second layer portion 21b. For example, the first distance d1 corresponds to the inter-layer distance of the multiple layer portions 21L. For example, the first distance d1 may be longer than at least one of the first lattice length L1 or the second lattice length L2.

Thus, the first layer portion 21a and the second layer portion 21b are provided in the first region 21. The distance (the distance along the X-axis direction) between these portions is longer than the lattice lengths (the lattice constants) of these layers. Thereby, the thermal conductivity along the X-axis direction in the first region 21 is lower than the thermal conductivity along the Z-Y plane in the first region 21. The thermal conductivity of the first region 21 has anisotropy. In one example, the first region 21 functions as a thermal barrier.

For example, by providing the first region 21, the heat of the first variable resistance portion 11 is not conducted easily along the X-axis direction. For example, scattering of the heat of the first variable resistance portion 11 can be suppressed. Thereby, for example, the temperature of the first variable resistance portion 11 can be increased efficiently. For example, the effects of the surrounding temperature on the first variable resistance portion 11 can be suppressed. On the other hand, for example, the uniformity of the temperature along the Z-Y plane in the first variable resistance portion 11 increases. The state of the electrical resistance of the first variable resistance portion 11 can be controlled easily thereby. For example, heat dissipation via the first electrically conductive portion 51 and the second electrically conductive portion 52 is suppressed during the decrease of the temperature of the first variable resistance portion 11.

According to the embodiment, a memory device can be provided in which the operations can be stable.

As shown in FIG. 1A, a first opposing region 21A may be further provided. For example, the first variable resistance portion 11 is provided between the first opposing region 21A and the first region 21 in the second direction (in the example, the X-axis direction).

As shown in FIG. 1A, the insulating portion 60 includes a first opposing insulating region 61A. The first opposing insulating region 61A is provided between the first opposing region 21A and the first variable resistance portion 11 in the second direction (e.g., the X-axis direction).

As shown in FIG. 1C, the first opposing region 21A includes a first opposing layer portion 21aA and a second opposing layer portion 21bA. The second opposing layer portion 21bA is provided between the first opposing layer portion 21aA and the first variable resistance portion 11 in the second direction (e.g., the X-axis direction). The first opposing layer portion 21aA and the second opposing layer portion 21bA are two layer portions of multiple layer portions 21LA provided in the first opposing region 21A.

The first opposing layer portion 21aA has a lattice length LA1 along an axis direction crossing the second direction (e.g., the X-axis direction). The second opposing layer portion 21bA has a lattice length LA2 along an axis direction crossing the second direction. A distance dA1 along the second direction (the X-axis direction) between the first opposing layer portion 21aA and the second opposing layer portion 21bA is longer than the lattice length LA1 of the first opposing layer portion 21aA. The distance dA1 is longer than the lattice length LA2 of the second opposing layer portion 21bA.

For example, anisotropy of the thermal conductivity is provided in the first opposing region 21A as well. For example, the temperature of the first variable resistance portion 11 can be increased efficiently. For example, the effects of the surrounding temperature on the first variable resistance portion 11 can be suppressed. For example, the uniformity of the temperature along the Z-Y plane in the first variable resistance portion 11 increases. For example, the heat dissipation via the first electrically conductive portion 51 and the second electrically conductive portion 52 is suppressed during the decrease of the temperature of the first variable resistance portion 11. For example, the state of the electrical resistance of the first variable resistance portion 11 can be controlled easily. The operations can be more stable.

An example of the first region 21 will now be described.

Figure 2A:
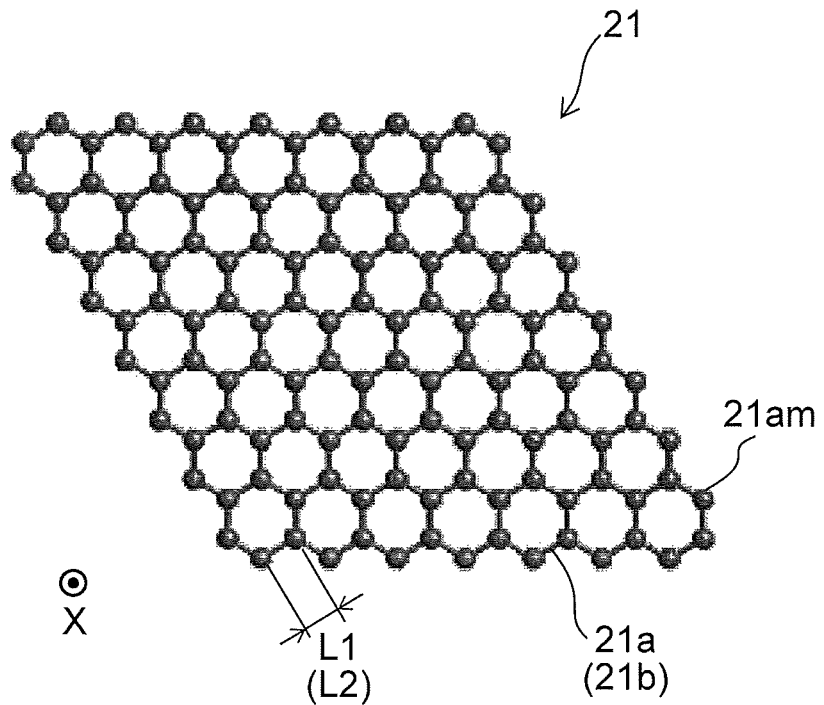
FIG. 2A and FIG. 2B are schematic views illustrating a portion of the memory device according to the first embodiment.
Figure 2B:
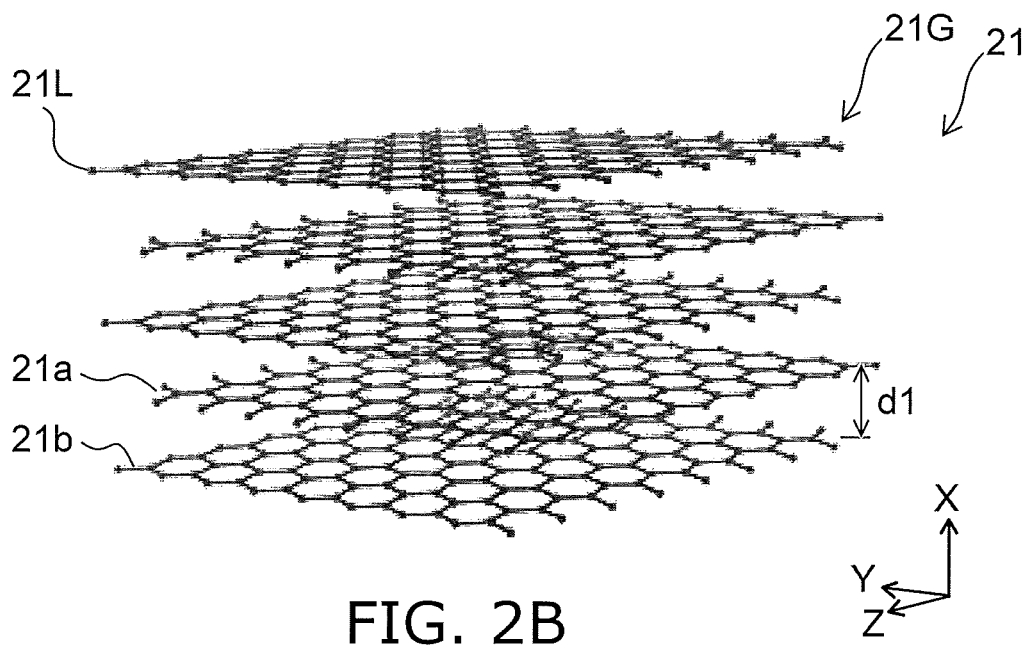

FIG. 2A and FIG. 2B are schematic views illustrating a portion of the memory device according to the first embodiment.

In the example, the first region 21 includes first graphite 21G. As shown in FIG. 2B, each of the multiple layer portions 21L included in the first region 21 includes graphene. For example, at least a portion of the first layer portion 21a and at least a portion of the second layer portion 21b each include graphene. These layer portions are stacked along the second direction (e.g., the X-axis direction). The distance along the X-axis direction between the multiple layer portions 21L (the distance along the X-axis direction between the lattices) corresponds to the first distance d1.

FIG. 2A illustrates one of the multiple layer portions 21L. For example, the first layer portion 21a includes multiple six-member rings. For example, the second layer portion 21b includes multiple six-member rings. For example, the distance between two lattice points of one side included in the six-member ring corresponds to the first lattice length L1 or the second lattice length L2.

Thus, in one example, the first layer portion 21a includes graphene. In such a case, the first lattice length L1 corresponds to the lattice length of the graphene of the first layer portion 21a.

For example, the second layer portion 21b includes graphene. In such a case, the second lattice length L2 corresponds to the lattice length of the graphene of the second layer portion 21b.

For example, the first lattice length L1 and the second lattice length L2 each are not less than 0.1 nm and not more than 0.2 nm. In the case where the first region 21 includes graphite, the first distance d1 is, for example, greater than 0.2 nm and not more than 1 nm.

In the embodiment, in the case where the first region 21 includes the first graphite 21G, the second direction (e.g., the X-axis direction) crosses the layer plane of the first graphite 21G (in the example shown in FIG. 2B, the Z-Y plane).

In the embodiment, one graphene sheet (e.g., a first graphene sheet 21ag, a first graphene: referring to FIG. 1B) may be provided in the first region 21. The one graphene sheet is, for example, the first layer portion 21a or the second layer portion 21b. For example, the second direction (the X-axis direction) crosses the layer plane of the first graphene sheet 21ag.

In the embodiment, the information that relates to the lattice lengths (the first lattice length L1, the second lattice length L2, etc.) and the inter-layer distances (the first distance d1, etc.) is obtained by, for example, a TEM image, etc. The information that relates to the crystal structure of the first region 21 is obtained by, for example, X-ray analysis, etc.

In the embodiment, the configuration of the first region 21 is applicable to the first opposing region 21A. The lattice length LA1 of the first opposing layer portion 21aA may be substantially similar to the first lattice length L1. The lattice length LA2 of the second opposing layer portion 21bA may be substantially similar to the second lattice length L2. The distance dA1 along the second direction between the first opposing layer portion 21aA and the second opposing layer portion 21bA may be substantially similar to the first distance d1.

Figure 3A:
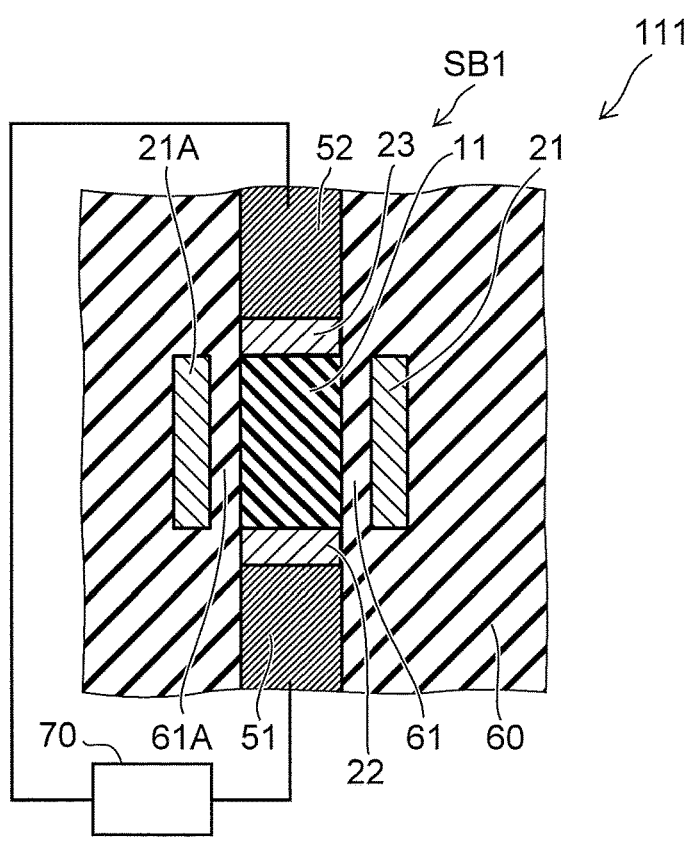
FIG. 3A to FIG. 3C are schematic cross-sectional views illustrating a memory device according to the first embodiment.
Figure 3B:
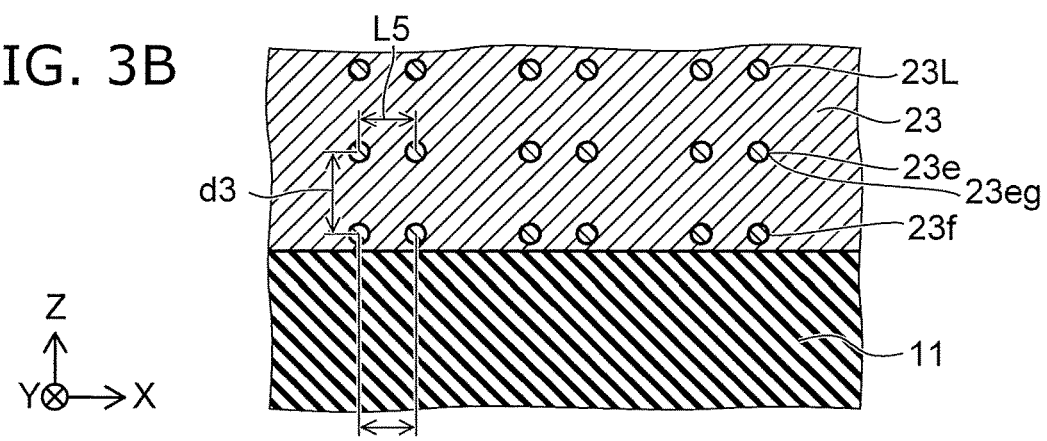
Figure 3C:
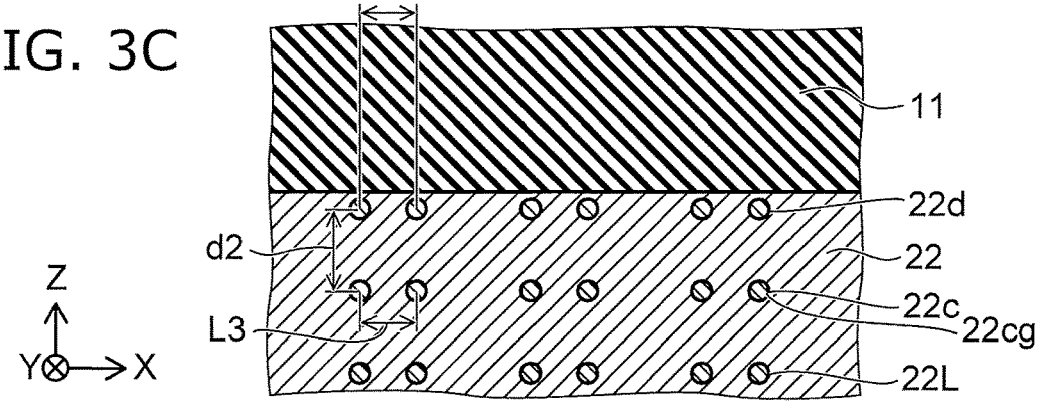

FIG. 3A to FIG. 3C are schematic cross-sectional views illustrating a memory device according to the first embodiment.

FIG. 3B and FIG. 3C schematically illustrate an enlargement of a portion of FIG. 3A.

As shown in FIG. 3A, the memory device 111 according to the embodiment includes a second region 22 and a third region 23 in addition to the first electrically conductive portion 51, the second electrically conductive portion 52, the first variable resistance portion 11, the first region 21, and the insulating portion 60. One of the second region 22 or the third region 23 may be provided in the embodiment. The first electrically conductive portion 51, the second electrically conductive portion 52, the first variable resistance portion 11, the first region 21, and the insulating portion 60 of the memory device 111 may have configurations similar to those of the memory device 110. Examples of the second region 22 and the third region 23 will now be described.

As shown in FIG. 3A, the second region 22 is provided between the first variable resistance portion 11 and the first electrically conductive portion 51 in the first direction (the Z-axis direction).

As shown in FIG. 3C, the second region 22 includes a third layer portion 22c and a fourth layer portion 22d. The fourth layer portion 22d is provided between the third layer portion 22c and the first variable resistance portion 11 in the first direction (the Z-axis direction). For example, the second region 22 includes multiple layer portions 22L. Two mutually-adjacent layer portions of the multiple layer portions 22L correspond to the third layer portion 22c and the fourth layer portion 22d.

The third layer portion 22c has a third lattice length L3 along a third axis direction crossing the first direction (the Z-axis direction). The fourth layer portion 22d has a fourth lattice length L4 along a fourth axis direction crossing the first direction (the Z-axis direction). A second distance d2 along the first direction (the Z-axis direction) between the third layer portion 22c and the fourth layer portion 22d is longer than the third lattice length L3 of the third layer portion 22c. The second distance d2 is longer than the fourth lattice length L4 of the fourth layer portion 22d. For example, the second distance d2 may be longer than at least one of the third lattice length L3 or the fourth lattice length L4.

The second distance d2 corresponds to the distance along the first direction between the position along the first direction (the Z-axis direction) of one lattice included in the third layer portion 22c and the position along the first direction (the Z-axis direction) of one lattice included in the fourth layer portion 22d. For example, the second distance d2 corresponds to the inter-layer distance of the multiple layer portions 22L.

For example, the thermal conductivity of the second region 22 has anisotropy. For example, by providing the second region 22, the heat of the first variable resistance portion 11 is not conducted easily to the first electrically conductive portion 51 along the Z-axis direction. For example, the heat dissipation from the first variable resistance portion 11 can be suppressed efficiently. For example, the uniformity of the temperature along the X-Y plane in the first variable resistance portion 11 increases. The operations can be more stable.

As shown in FIG. 3A, the third region 23 is provided between the first variable resistance portion 11 and the second electrically conductive portion 52 in the first direction (the Z-axis direction).

As shown in FIG. 3B, the third region 23 includes a fifth layer portion 23e and a sixth layer portion 23f. The sixth layer portion 23f is provided between the fifth layer portion 23e and the first variable resistance portion 11 in the first direction (the Z-axis direction). For example, the third region 23 includes multiple layer portions 23L. Two mutually-adjacent layer portions of the multiple layer portions 23L correspond to the fifth layer portion 23e and the sixth layer portion 23f.

The fifth layer portion 23e has a fifth lattice length L5 along a fifth axis direction crossing the first direction (the Z-axis direction). The sixth layer portion 23f has a sixth lattice length L6 along a sixth axis direction crossing the first direction (the Z-axis direction). A third distance d3 along the first direction (the Z-axis direction) between the fifth layer portion 23e and the sixth layer portion 23f is longer than the fifth lattice length L5 of the fifth layer portion 23e. The third distance d3 is longer than the sixth lattice length L6 of the sixth layer portion 23f. For example, the third distance d3 may be longer than at least one of the fifth lattice length L5 or the sixth lattice length L6.

The third distance d3 corresponds to the distance along the first direction between the position along the first direction (the Z-axis direction) of one lattice included in the fifth layer portion 23e and the position along the first direction (the Z-axis direction) of one lattice included in the sixth layer portion 23f. For example, the third distance d3 corresponds to the inter-layer distance of the multiple layer portions 23L.

For example, the thermal conductivity of the third region 23 has anisotropy. For example, by providing the third region 23, the heat of the first variable resistance portion 11 is not conducted easily to the second electrically conductive portion 52 along the Z-axis direction. For example, the heat dissipation from the first variable resistance portion 11 can be suppressed efficiently. For example, the uniformity of the temperature along the X-Y plane in the first variable resistance portion 11 increases. The operations can be more stable.

Figure 4A:
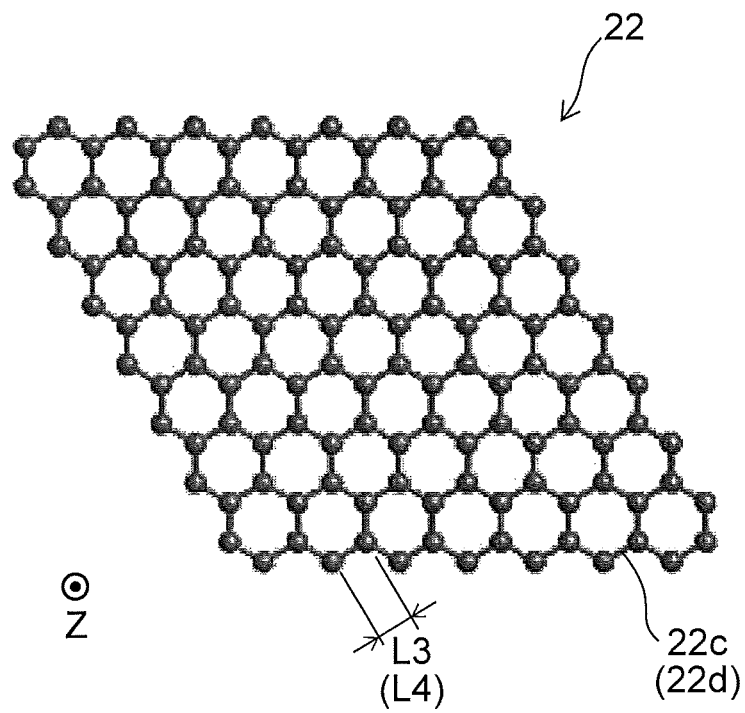
FIG. 4A and FIG. 4B are schematic views illustrating a portion of the memory device according to the first embodiment.
Figure 4B:
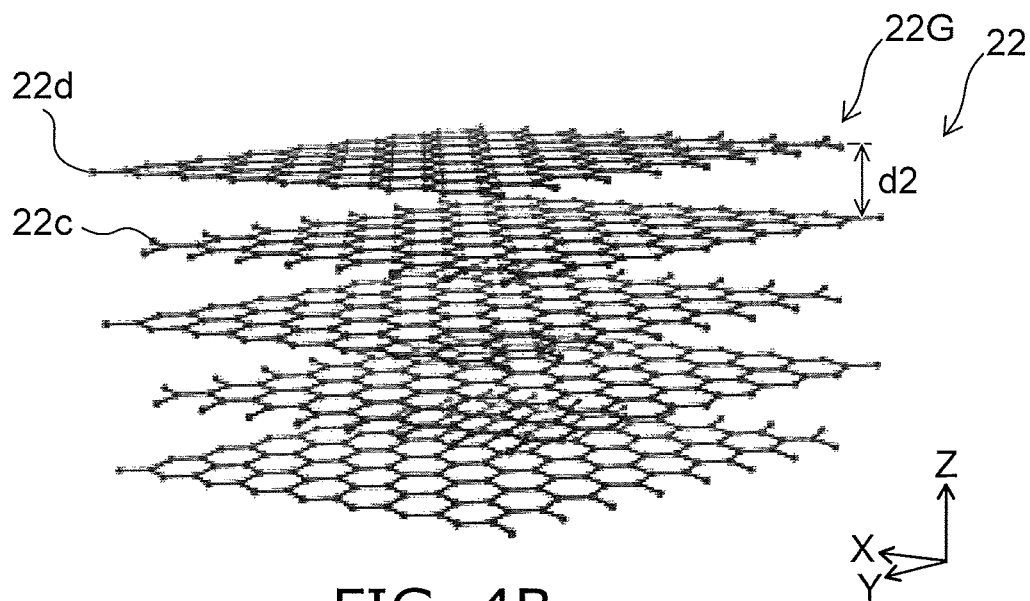

FIG. 4A and FIG. 4B are schematic views illustrating a portion of the memory device according to the first embodiment.

In the example, the second region 22 includes second graphite 22G. As shown in FIG. 4B, each of the multiple layer portions 22L included in the second region 22 includes graphene. For example, at least a portion of the third layer portion 22c and at least a portion of the fourth layer portion 22d each include graphene. These layer portions are stacked along the first direction (e.g., the Z-axis direction). The distance along the Z-axis direction between the multiple layer portions 22L (the distance along the Z-axis direction between the lattices) corresponds to the second distance d2.

As shown in FIG. 4A, for example, the third layer portion 22c includes graphene. The third lattice length L3 corresponds to the lattice length of the graphene of the third layer portion 22c. For example, the fourth layer portion 22d includes graphene. The fourth lattice length L4 corresponds to the lattice length of the graphene of the fourth layer portion 22d.

In the embodiment, in the case where the second region 22 includes the second graphite 22G, the first direction (e.g., the Z-axis direction) crosses the layer plane of the second graphite 22G (in the example shown in FIG. 4B, the X-Y plane).

In the embodiment, one graphene sheet (e.g., a second graphene sheet 22cg, a second graphene: referring to FIG. 3C) may be provided in the second region 22. For example, the one graphene sheet corresponds to the third layer portion 22c or the fourth layer portion 22d. The first direction (the Z-axis direction) crosses the layer plane of the second graphene sheet 22cg.

Figure 5A:
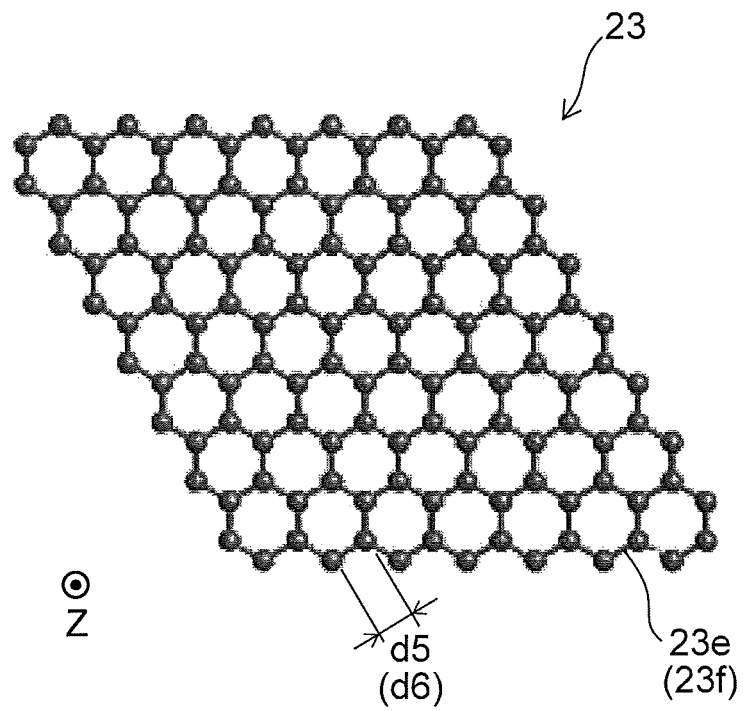
FIG. 5A and FIG. 5B are schematic views illustrating a portion of the memory device according to the first embodiment.
Figure 5B:
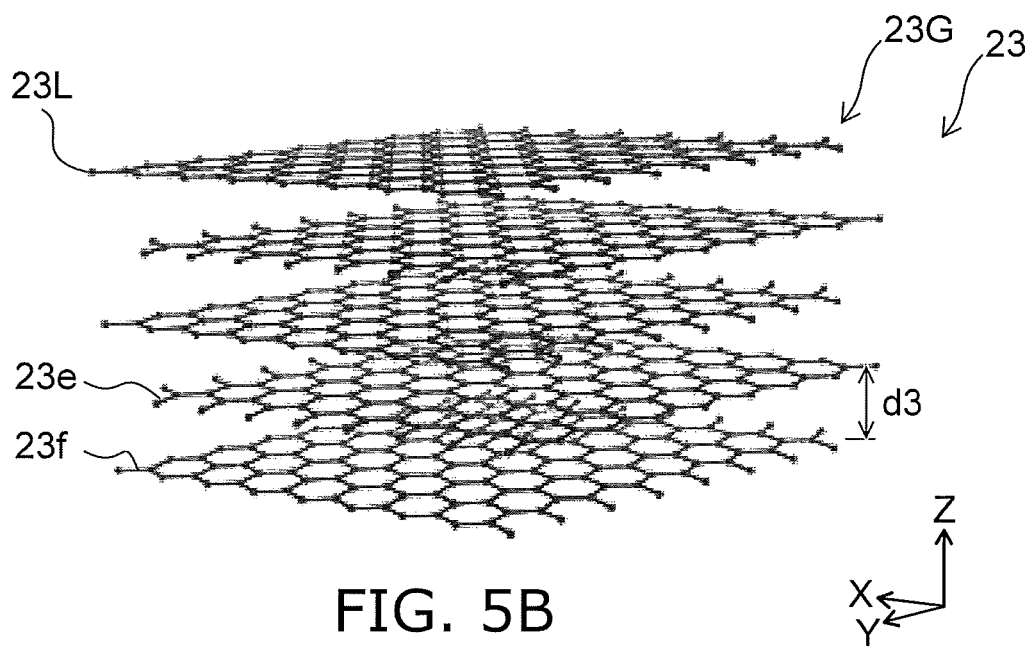

FIG. 5A and FIG. 5B are schematic views illustrating a portion of the memory device according to the first embodiment.

In the example, the third region 23 includes third graphite 23G. As shown in FIG. 5B, each of the multiple layer portions 23L included in the third region 23 includes graphene. For example, at least a portion of the fifth layer portion 23e and at least a portion of the sixth layer portion 23f each include graphene. These layer portions are stacked along the first direction (e.g., the Z-axis direction). The distance along the Z-axis direction between the multiple layer portions 23L (the distance along the Z-axis direction between the lattices) corresponds to the third distance d3.

As shown in FIG. 5A, for example, the fifth layer portion 23e includes graphene. The fifth lattice length L5 corresponds to the lattice length of the graphene of the fifth layer portion 23e. For example, the sixth layer portion 23f includes graphene. The sixth lattice length L6 corresponds to the lattice length of the graphene of the sixth layer portion 23f.

In the embodiment, in the case where the third region 23 includes the third graphite 23G, the first direction (e.g., the Z-axis direction) crosses the layer plane of the third graphite 23G (in the example shown in FIG. 5B, the X-Y plane).

In the embodiment, one graphene sheet (e.g., a third graphene sheet 23eg, a third graphene: referring to FIG. 3B) may be provided in the third region 23. For example, the one graphene sheet corresponds to the fifth layer portion 23e or the sixth layer portion 23f. For example, the first direction (the Z-axis direction) crosses the layer plane of the third graphene sheet 23eg.

The third lattice length L3 and the fifth lattice length L5 may be the same as the first lattice length L1. The fourth lattice length L4 and the sixth lattice length L6 may be the same as the second lattice length L2. At least one of the second distance d2 or the third distance d3 may be the same as the first distance d1.

Figure 6:
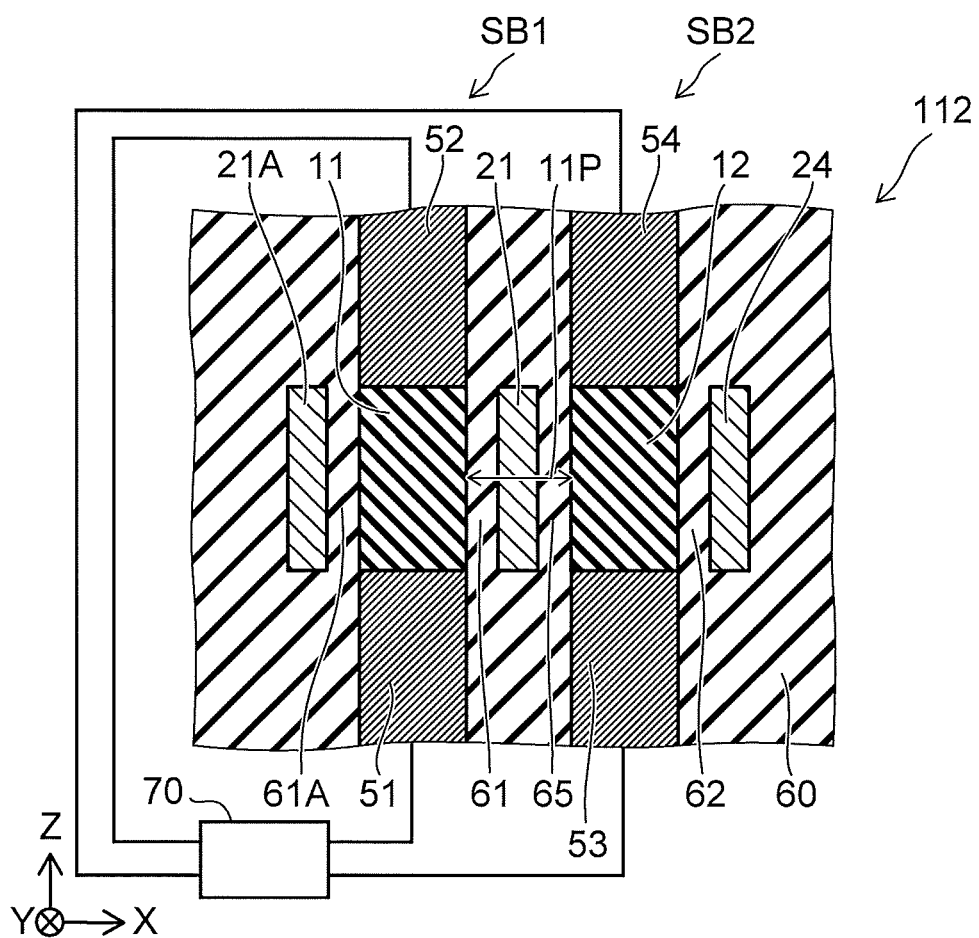
FIG. 6 is a schematic cross-sectional view illustrating a memory device according to the first embodiment.

FIG. 6 is a schematic cross-sectional view illustrating a memory device according to the first embodiment.

As shown in FIG. 6, the memory device 112 according to the embodiment includes a third electrically conductive portion 53, a fourth electrically conductive portion 54, and a second variable resistance portion 12 in addition to the first electrically conductive portion 51, the second electrically conductive portion 52, the first variable resistance portion 11, the first region 21, and the insulating portion 60. The first electrically conductive portion 51, the second electrically conductive portion 52, the first variable resistance portion 11, and the first region 21 of the memory device 112 are similar to those of the memory device 110; and a description is therefore omitted. Examples of the third electrically conductive portion 53, the fourth electrically conductive portion 54, and the second variable resistance portion 12 will now be described.

The direction from the third electrically conductive portion 53 toward the fourth electrically conductive portion 54 is aligned with the first direction (the Z-axis direction). The second variable resistance portion 12 is provided between the third electrically conductive portion 53 and the fourth electrically conductive portion 54. For example, the first region 21 is provided between the first variable resistance portion 11 and the second variable resistance portion 12 in the second direction (the X-axis direction).

The insulating portion 60 includes an insulating region 65 provided between the first variable resistance portion 11 and the second variable resistance portion 12 in the second direction (the X-axis direction). The insulating region 65 is provided between the first region 21 and the second variable resistance portion 12 in the second direction (the X-axis direction).

For example, the third electrically conductive portion 53 and the fourth electrically conductive portion 54 are electrically connected to the controller 70.

For example, the second variable resistance portion 12 functions as another one memory cell. At least one of the third electrically conductive portion 53 or the fourth electrically conductive portion 54 may be included in the memory cell. The second variable resistance portion 12 is included in a second stacked body SB2. At least one of the third electrically conductive portion 53 or the fourth electrically conductive portion 54 may be included in the second stacked body SB2.

For example, by providing the first region 21, the heat of the first variable resistance portion 11 is not conducted easily to the second variable resistance portion 12. The heat of the second variable resistance portion 12 is not conducted easily to the first variable resistance portion 11. A memory device can be provided in which the operations can be stable.

Second Embodiment

Figure 7A:
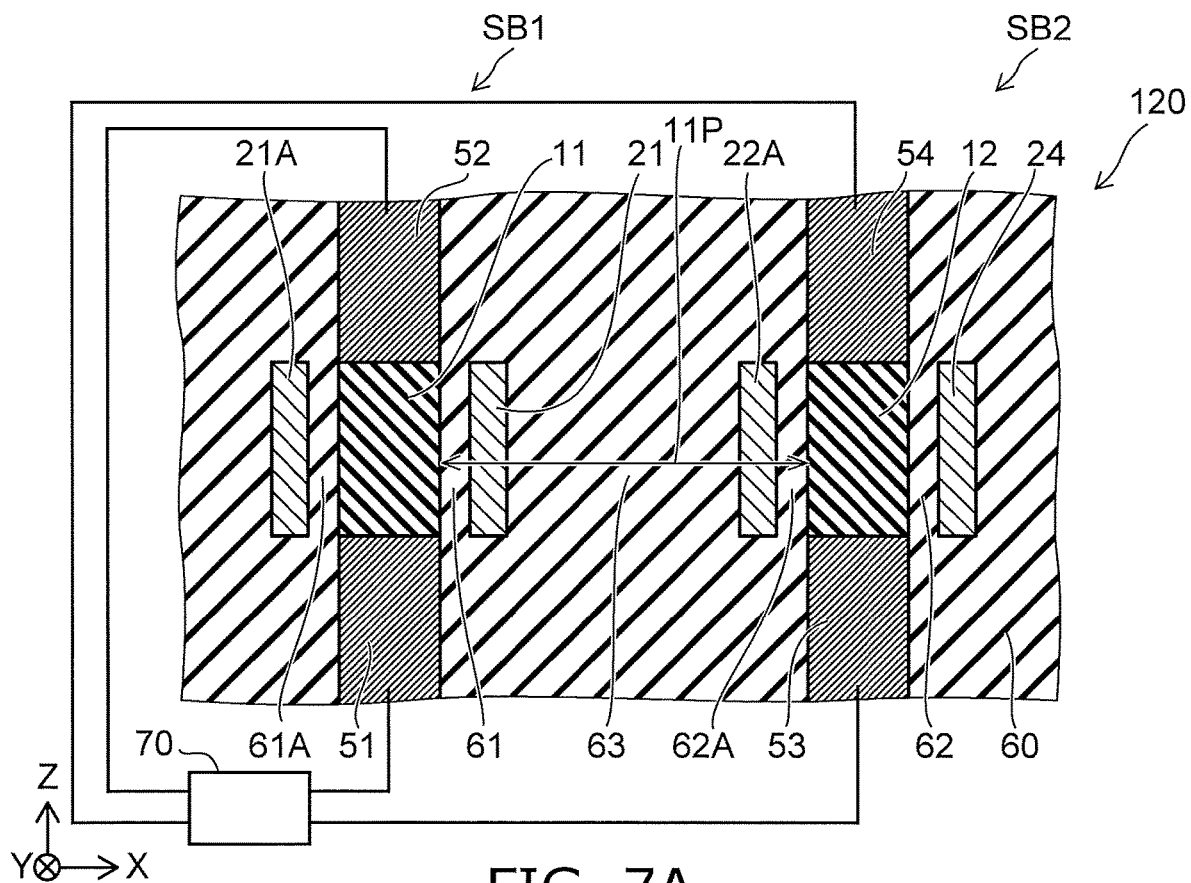
FIG. 7A to FIG. 7C are schematic cross-sectional views illustrating a memory device according to a second embodiment.
Figure 7B:
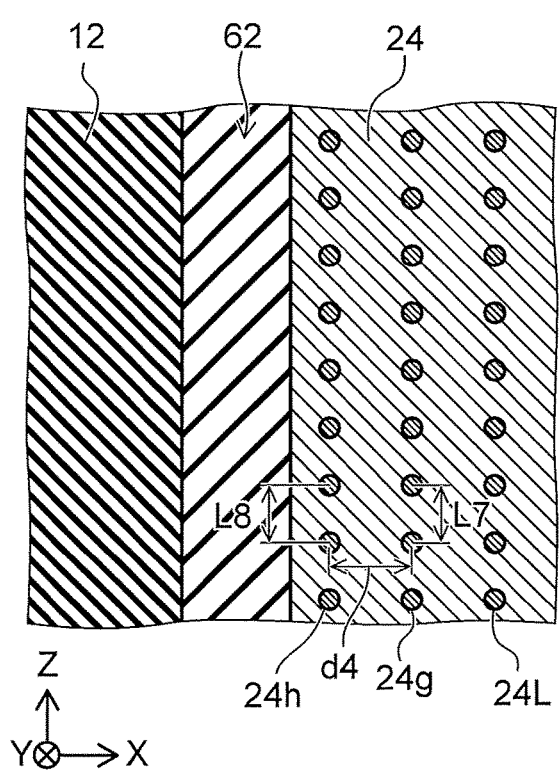
Figure 7C:
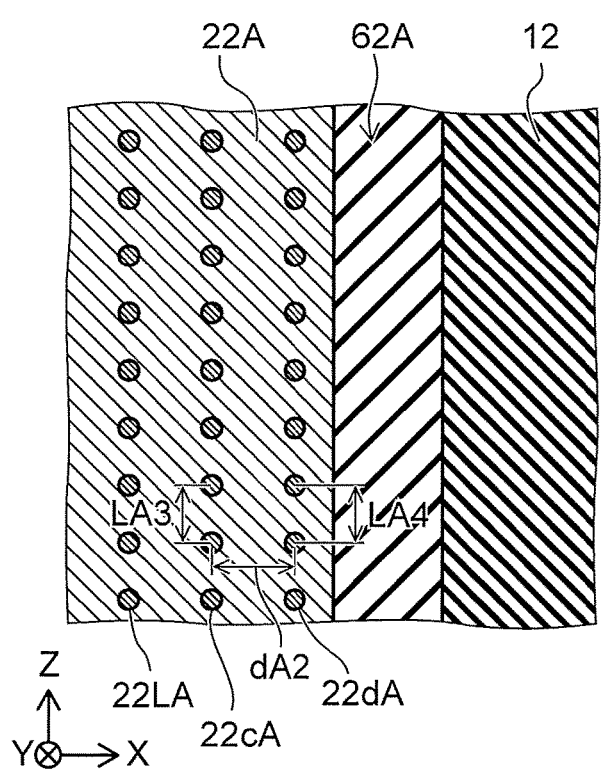

FIG. 7A to FIG. 7C are schematic cross-sectional views illustrating a memory device according to a second embodiment.

FIG. 7B and FIG. 7C schematically illustrate an enlargement of a portion of FIG. 7A.

As shown in FIG. 7A, the memory device 120 according to the embodiment includes the third electrically conductive portion 53, the fourth electrically conductive portion 54, the second variable resistance portion 12, and a fourth region 24 in addition to the first electrically conductive portion 51, the second electrically conductive portion 52, the first variable resistance portion 11, the first region 21, and the insulating portion 60. The first electrically conductive portion 51, the second electrically conductive portion 52, the first variable resistance portion 11, and the first region 21 of the memory device 120 are similar to those of the memory device 110; and a description is therefore omitted. Examples of the third electrically conductive portion 53, the fourth electrically conductive portion 54, the second variable resistance portion 12, and the fourth region 24 will now be described.

The third electrically conductive portion 53, the fourth electrically conductive portion 54, and the second variable resistance portion 12 of the memory device 120 may be similar to those of the memory device 112. For example, the direction from the third electrically conductive portion 53 toward the fourth electrically conductive portion 54 is aligned with the first direction (the Z-axis direction). The second variable resistance portion 12 is provided between the third electrically conductive portion 53 and the fourth electrically conductive portion 54. For example, the first region 21 is provided between the first variable resistance portion 11 and the second variable resistance portion 12 in the second direction (the X-axis direction).

For example, the direction from the second variable resistance portion 12 toward the fourth region 24 is aligned with the second direction (e.g., the X-axis direction). In the example, the second variable resistance portion 12 is provided between the first variable resistance portion 11 and the fourth region 24.

The insulating portion 60 includes a second insulating region 62. The second insulating region 62 is provided between the second variable resistance portion 12 and the fourth region 24 in the second direction (the X-axis direction).

As shown in FIG. 7B, the fourth region 24 includes a seventh layer portion 24g and an eighth layer portion 24h. The eighth layer portion 24h is provided between the second variable resistance portion 12 and the seventh layer portion 24g in the second direction (e.g., the X-axis direction). Multiple layer portions 24L are provided in the fourth region 24. For example, two mutually-adjacent layer portions of the multiple layer portions 24L correspond to the seventh layer portion 24g and the eighth layer portion 24h.

The seventh layer portion 24g has a seventh lattice length L7 along a seventh axis direction crossing the second direction (the X-axis direction). The eighth layer portion 24h has an eighth lattice length L8 along an eighth axis direction crossing the second direction. In one example, the seventh axis direction is along the Z-Y plane. In one example, the eighth axis direction is along the Z-Y plane.

A fourth distance d4 along the second direction (the X-axis direction) between the seventh layer portion 24g and the eighth layer portion 24h is longer than the seventh lattice length L7 of the seventh layer portion 24g. The fourth distance d4 is longer than the eighth lattice length L8 of the eighth layer portion 24h. For example, the fourth distance d4 may be longer than at least one of the seventh lattice length L7 or the eighth lattice length L8.

The thermal conductivity along the X-axis direction in the fourth region 24 is lower than the thermal conductivity along the Z-Y plane in the fourth region 24. The operations of the second variable resistance portion 12 can be stable.

As shown in FIG. 7A, a second opposing region 22A is further provided in the memory device 120. The second variable resistance portion 12 is provided between the second opposing region 22A and the fourth region 24 in the second direction (e.g., the X-axis direction).

In the example, the insulating portion 60 further includes a second opposing insulating region 62A. The second opposing insulating region 62A is provided between the second opposing region 22A and the second variable resistance portion 12 in the second direction (e.g., the X-axis direction).

As shown in FIG. 7B, the second opposing region 22A includes a third opposing layer portion 22cA and a fourth opposing layer portion 22dA. The fourth opposing layer portion 22dA is provided between the third opposing layer portion 22cA and the second variable resistance portion 12 in the second direction (e.g., the X-axis direction). Multiple layer portions 22LA are provided in the second opposing region 22A. Two mutually-adjacent layer portions of the multiple layer portions 22LA correspond to the third opposing layer portion 22cA and the fourth opposing layer portion 22dA.

The third opposing layer portion 22cA has a lattice length LA3 along an axis direction crossing the second direction (e.g., the X-axis direction). The fourth opposing layer portion 22dA has a lattice length LA4 along an axis direction crossing the second direction. A distance dA2 along the second direction (e.g., the X-axis direction) between the third opposing layer portion 22cA and the fourth opposing layer portion 22dA is longer than the lattice length LA3 of the third opposing layer portion 22cA. The distance dA2 is longer than the lattice length LA4 of the fourth opposing layer portion 22dA. For example, anisotropy of the thermal conductivity is provided in the second opposing region 22A.

As shown in FIG. 7A, the insulating portion 60 includes a third insulating region 63. For example, the third insulating region 63 is provided between the first region 21 and the second opposing region 22A in the second direction (e.g., the X-axis direction).

Figure 8A:
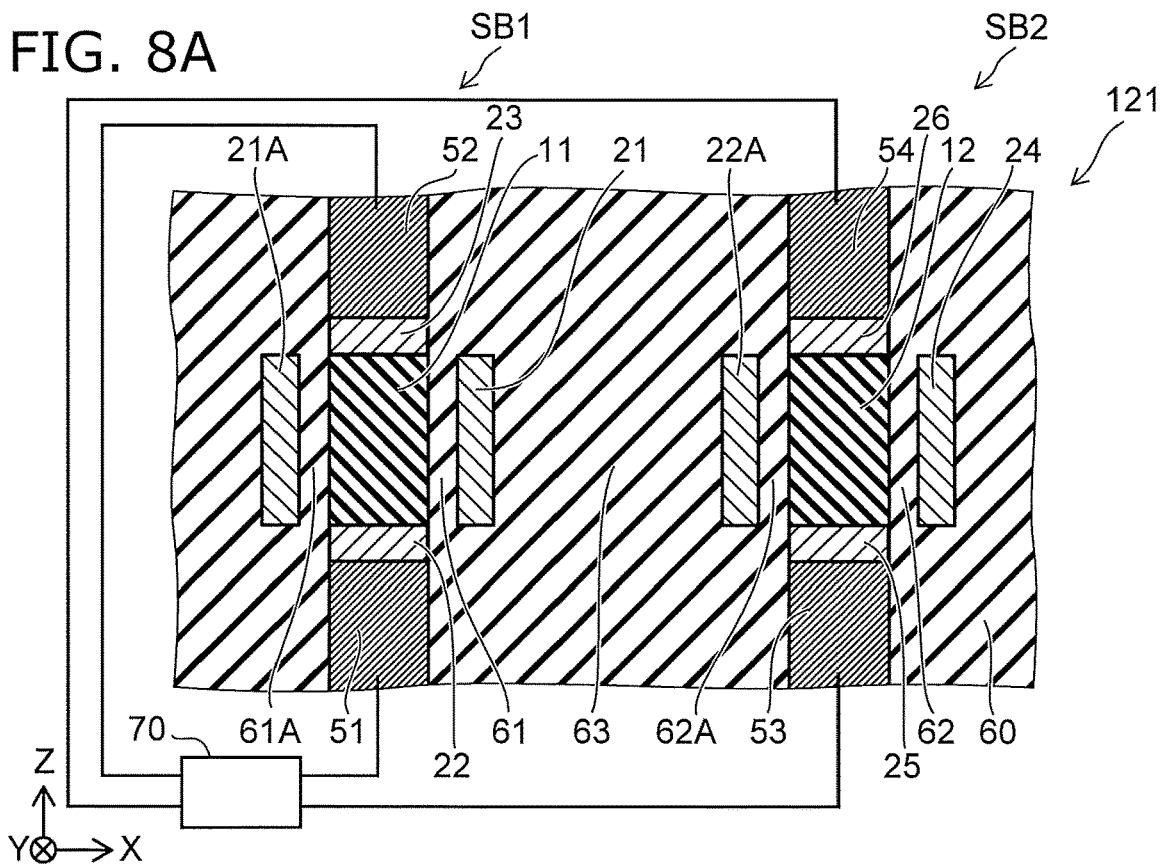
FIG. 8A to FIG. 8C are schematic cross-sectional views illustrating a memory device according to the second embodiment.
Figure 8B:
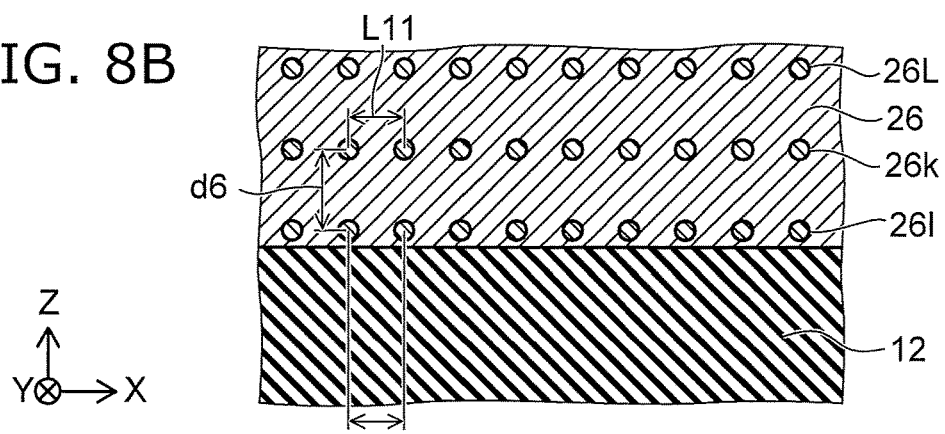
Figure 8C:
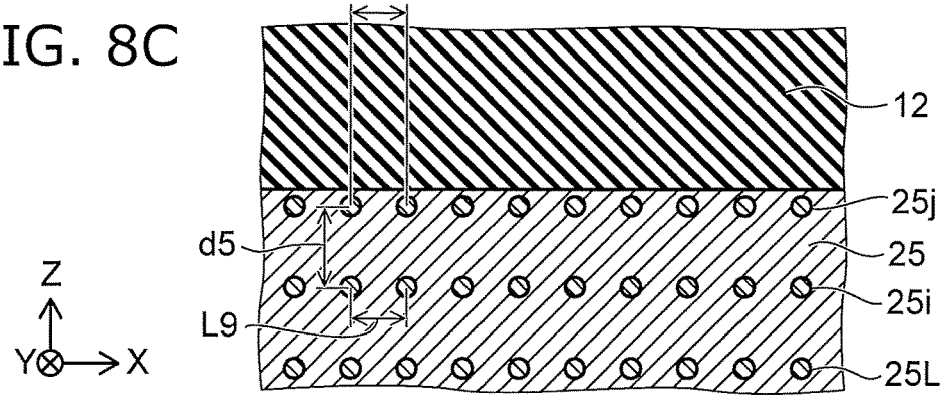

FIG. 8A to FIG. 8C are schematic cross-sectional views illustrating a memory device according to the second embodiment.

FIG. 8B and FIG. 8C schematically illustrate an enlargement of a portion of FIG. 8A.

As shown in FIG. 8A, the memory device 121 according to the embodiment includes a fifth region 25 and a sixth region 26 in addition to the first electrically conductive portion 51, the second electrically conductive portion 52, the first variable resistance portion 11, the first region 21, the insulating portion 60, the second region 22, the third region 23, and the fourth region 24. One of the fifth region 25 or the sixth region 26 may be provided in the embodiment.

For the memory device 121, the description of configurations similar to the memory device 120 is omitted. Examples of the fifth region 25 and the sixth region 26 will now be described.

As shown in FIG. 8A, the fifth region 25 is provided between the second variable resistance portion 12 and the third electrically conductive portion 53 in the first direction (the Z-axis direction).

As shown in FIG. 8C, the fifth region 25 includes a ninth layer portion 25i and a tenth layer portion 25j. The tenth layer portion 25j is provided between the ninth layer portion 25i and the second variable resistance portion 12 in the first direction (the Z-axis direction).

The ninth layer portion 25i has a ninth lattice length L9 along a ninth axis direction crossing the first direction (the Z-axis direction). The tenth layer portion 25j has a tenth lattice length L10 along a tenth axis direction crossing the first direction.

A fifth distance d5 along the first direction (the Z-axis direction) between the ninth layer portion 25i and the tenth layer portion 25j is longer than the ninth lattice length L9 of the ninth layer portion 25i. The fifth distance d5 is longer than the tenth lattice length L10 of the tenth layer portion 25j. For example, the fifth distance d5 may be longer than at least one of the ninth lattice length L9 or the tenth lattice length L10.

As shown in FIG. 8A, the sixth region 26 is provided between the second variable resistance portion 12 and the fourth electrically conductive portion 54 in the first direction (the Z-axis direction).

As shown in FIG. 8B, the sixth region 26 includes an eleventh layer portion 26k and a twelfth layer portion 26l. The twelfth layer portion 26l is provided between the eleventh layer portion 26k and the second variable resistance portion 12 in the first direction (the Z-axis direction).

The eleventh layer portion 26k has an eleventh lattice length L11 along an eleventh axis direction crossing the first direction (the Z-axis direction). The twelfth layer portion 26l has a twelfth lattice length L12 along a twelfth axis direction crossing the first direction.

A sixth distance d6 along the first direction (the Z-axis direction) between the eleventh layer portion 26k and the twelfth layer portion 26l is longer than the eleventh lattice length L11 of the eleventh layer portion 26k. The sixth distance d6 is longer than the twelfth lattice length L12 of the twelfth layer portion 26l. For example, the sixth distance d6 may be longer than at least one of the eleventh lattice length L11 or the twelfth lattice length L12.

For example, the thermal conductivity along the Z-axis direction is lower than the thermal conductivity along the X-Y plane for the fifth region 25 and the sixth region 26. For example, anisotropy of the thermal conductivity is provided in these regions. For example, the operations of the second variable resistance portion 12 can be stable.

Figure 9:
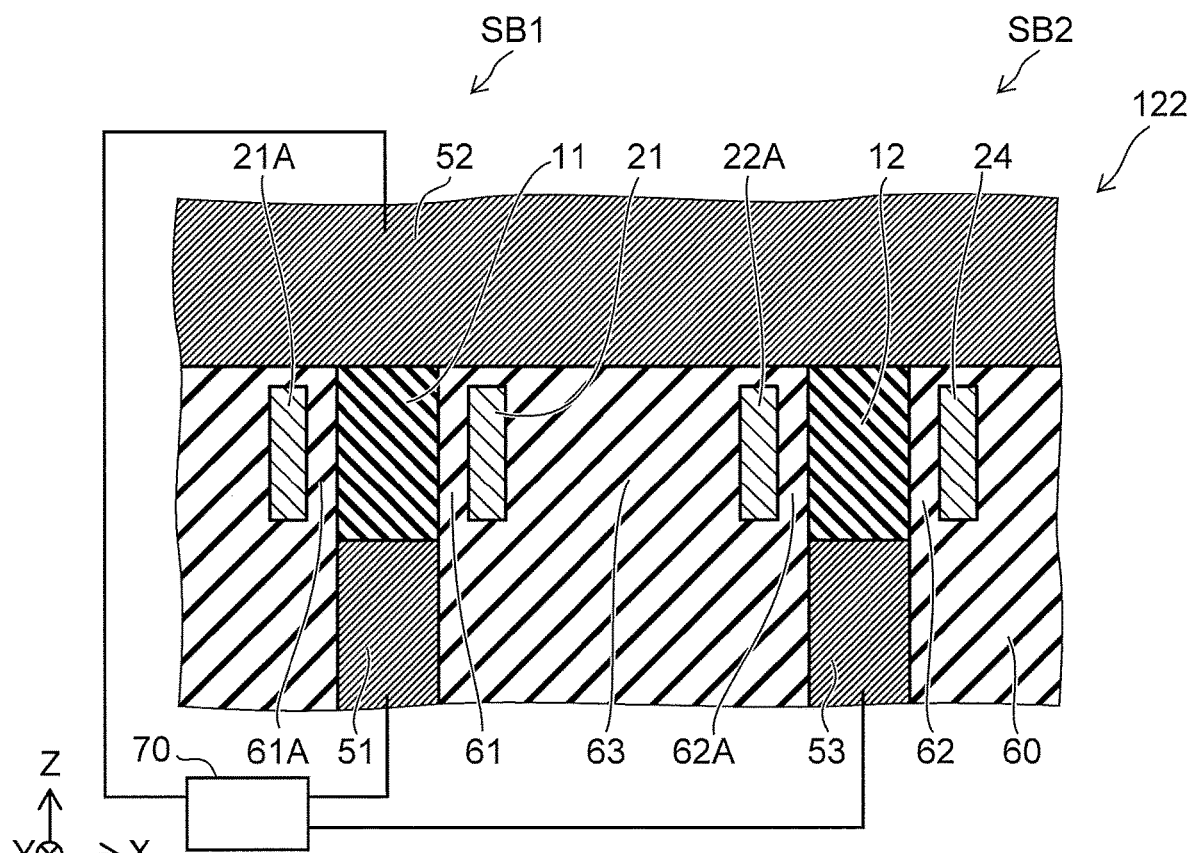
FIG. 9 is a schematic cross-sectional view illustrating a memory device according to the second embodiment.

FIG. 9 is a schematic cross-sectional view illustrating a memory device according to the second embodiment.

In the memory device 122 as shown in FIG. 9, the first variable resistance portion 11 is provided between the first electrically conductive portion 51 and a portion of the second electrically conductive portion 52. The second variable resistance portion 12 is provided between the third electrically conductive portion 53 and another portion of the second electrically conductive portion 52. Otherwise, the configuration of the memory device 122 is similar to the configuration of the memory device 120.

Figure 10:
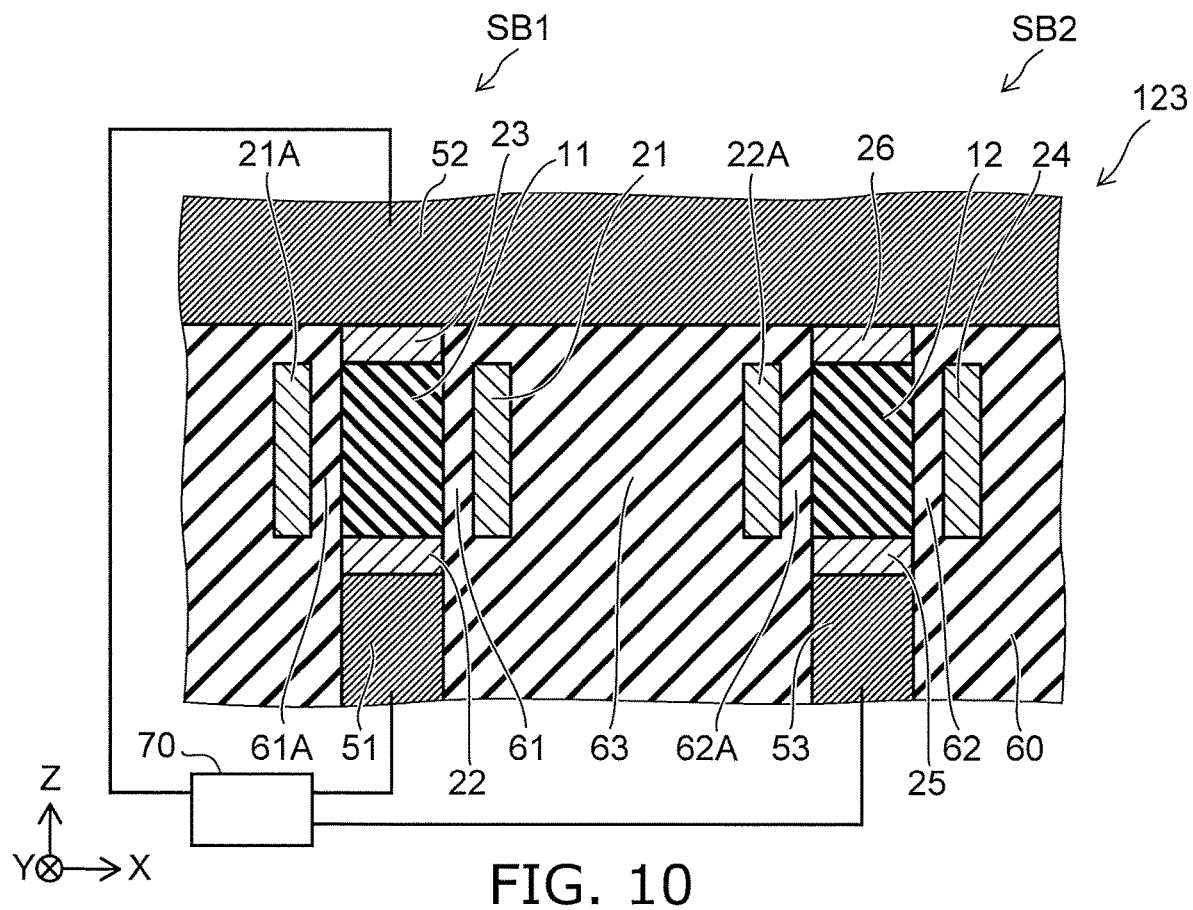
FIG. 10 is a schematic cross-sectional view illustrating a memory device according to the second embodiment.

FIG. 10 is a schematic cross-sectional view illustrating a memory device according to the second embodiment.

In the memory device 123 as shown in FIG. 10, the first variable resistance portion 11 is provided between the first electrically conductive portion 51 and a portion of the second electrically conductive portion 52. The second variable resistance portion 12 is provided between the third electrically conductive portion 53 and another portion of the second electrically conductive portion 52. Otherwise, the configuration of the memory device 123 is similar to the configuration of the memory device 121. The third region 23 is provided between the first variable resistance portion 11 and the portion of the second electrically conductive portion 52 recited above. The sixth region 26 is provided between the second variable resistance portion 12 and the other portion of the second electrically conductive portion 52 recited above.

In the memory devices 122 and 123, for example, the first electrically conductive portion 51 and the third electrically conductive portion 53 extend along the Y-axis direction. The second electrically conductive portion 52 extends along the X-axis direction.

In the memory devices 112 and 120 to 123, for example, the fourth region 24, the second opposing region 22A, the fifth region 25, and the sixth region 26 include graphite. One graphene sheet may be provided in each of these regions.

Figure 11A:
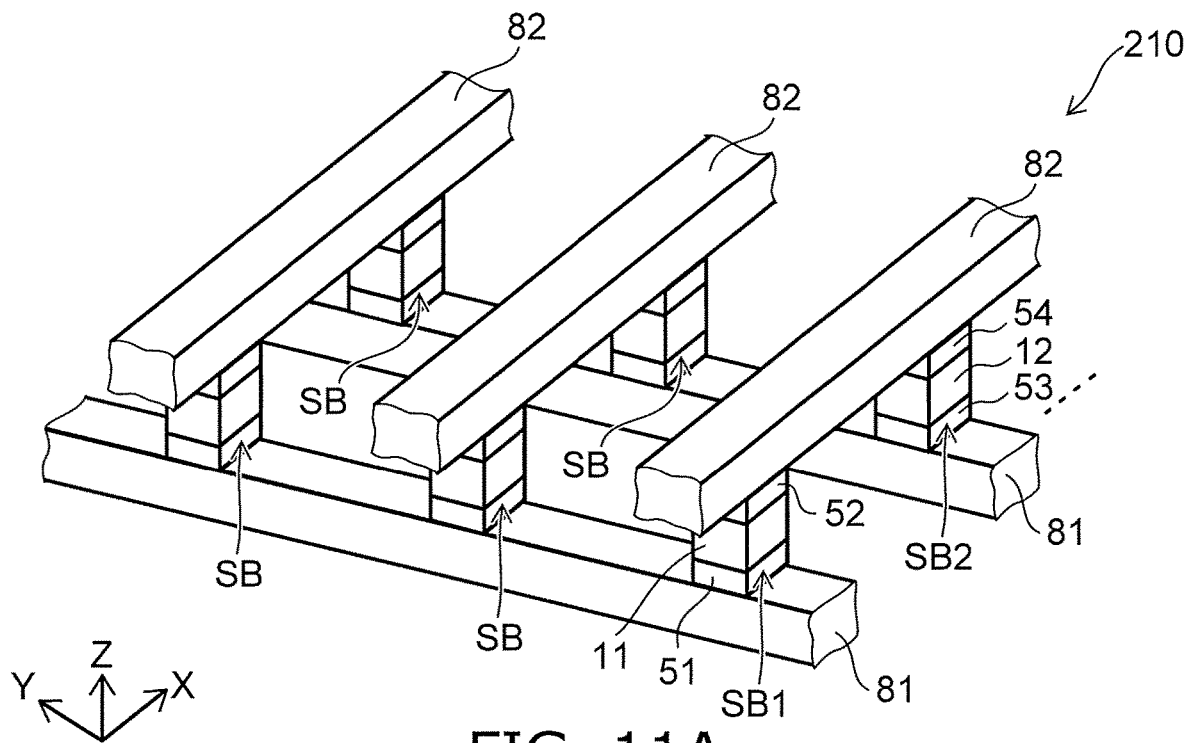
FIG. 11A and FIG. 11B are schematic perspective views illustrating memory devices according to the second embodiment.
Figure 11B:
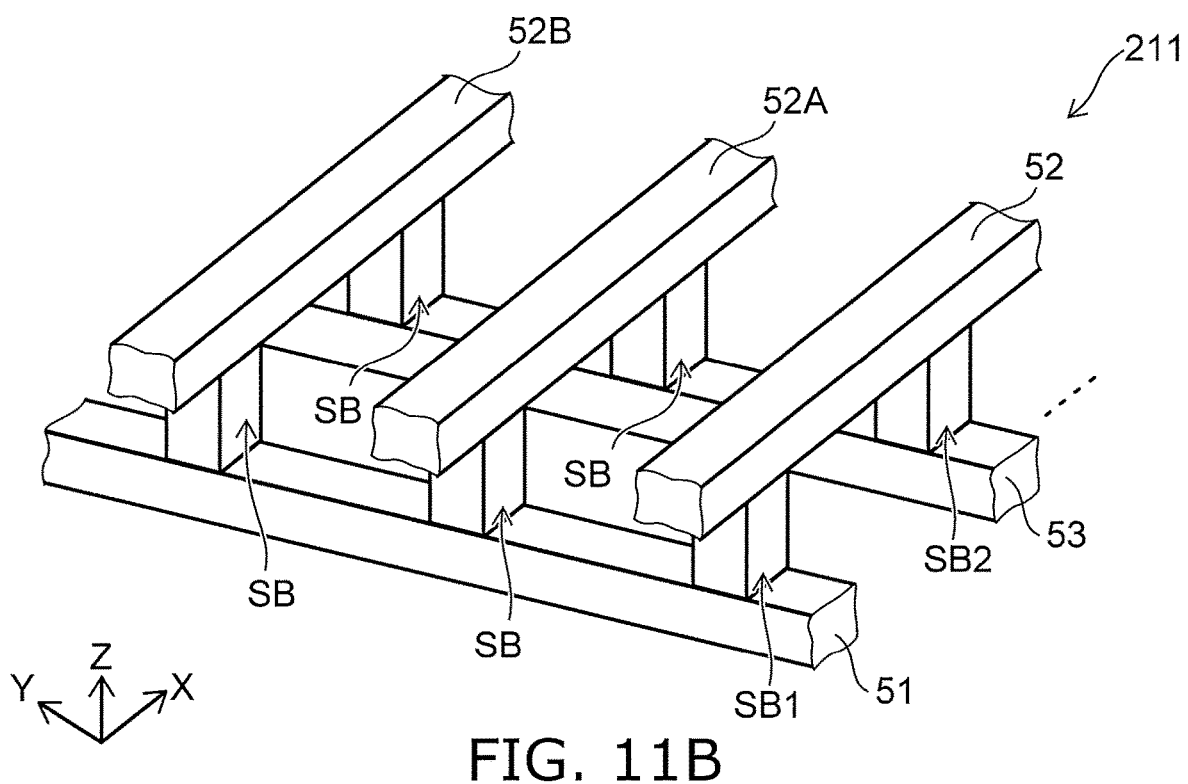

FIG. 11A and FIG. 11B are schematic perspective views illustrating memory devices according to the second embodiment.

In these drawings, the insulating portion 60 is not illustrated for easier viewing. The first to sixth regions 21 to 26, the first opposing region 21A, and the second opposing region 22A also are not illustrated.

As shown in FIG. 11A, multiple first interconnects 81 are provided in a memory apparatus 210. In the example, the multiple first interconnects 81 extend along the Y-axis direction and are arranged along the X-axis direction. Multiple second interconnects 82 are provided in the example. The multiple second interconnects 82 extend along the X-axis direction and are arranged along the Y-axis direction. Stacked bodies SB are provided between the multiple first interconnects 81 and the multiple second interconnects 82. Each stacked body SB (e.g., the first stacked body SB1) includes electrically conductive portions (e.g., the first electrically conductive portion 51 and the second electrically conductive portion 52) and a variable resistance portion (e.g., the first variable resistance portion 11).

In a memory apparatus 211 as shown in FIG. 11B, the first electrically conductive portion 51 and the third electrically conductive portion 53 extend along the Y-axis direction. The second electrically conductive portion 52, an electrically conductive portion 52A, and an electrically conductive portion 52B extend along the X-axis direction. For example, the first electrically conductive portion 51 and the third electrically conductive portion 53 correspond to multiple first interconnects. For example, the second electrically conductive portion 52, the electrically conductive portion 52A, and the electrically conductive portion 52B correspond to multiple second interconnects. The stacked bodies SB are provided between the multiple first interconnects and the multiple second interconnects. The stacked body SB includes a variable resistance portion.

In the embodiment, the variable resistance portion (e.g., the first variable resistance portion 11) may include, for example, at least one selected from the group consisting of germanium, tellurium, antimony, selenium, arsenic, silicon, bismuth, and tin.

At least one of the first to fourth electrically conductive portions 51 to 54 may include, for example, at least one selected from the group consisting of tungsten, molybdenum, aluminum, carbon, copper, and titanium.

In the embodiment, the insulating portion 60 may include, for example, at least one first element selected from the group consisting of silicon, aluminum, hafnium, and titanium and at least one second element selected from the group consisting of oxygen and nitrogen.

In the embodiment, at least one of the first to sixth regions 21 to 26 may include, for example, graphene. At least one of the first to sixth regions 21 to 26 may include, for example, graphite. At least one of the first to sixth regions 21 to 26 may include, for example, at least one selected from the group consisting of molybdenum disulfide, boron nitride, tungsten disulfide, tungsten selenide, molybdenum selenide, and phosphorus.

An example of characteristics of the first region 21 will now be described as one example.

Figure 12A:
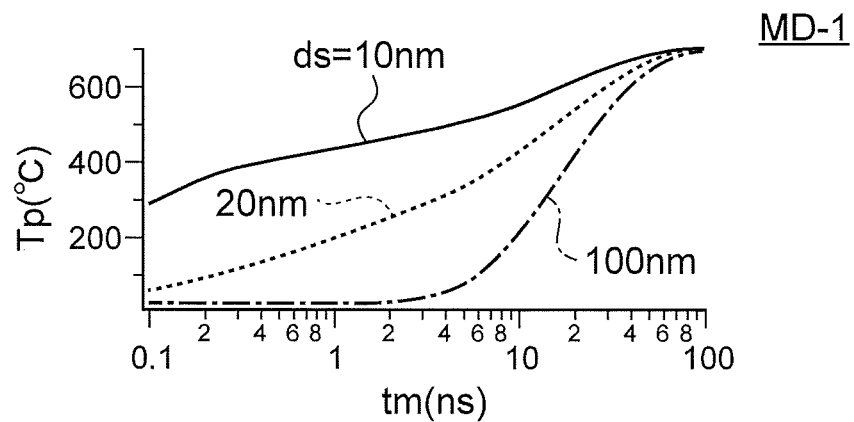
FIG. 12A and FIG. 12B are graphs illustrating characteristics of the memory device.
Figure 12B:
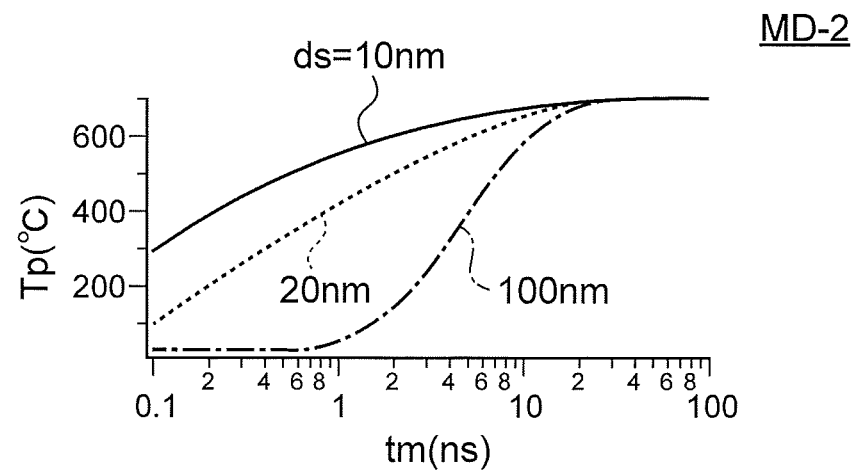

FIG. 12A and FIG. 12B are graphs illustrating characteristics of the memory device.

These figures show examples of simulation results of the change of the temperature of the memory device. In a first model MD-1 of the simulation, graphene is provided as the first region 21. The plane of the graphene is along the Z-Y plane (referring to FIG. 1A). The first insulating region 61 is provided between the first variable resistance portion 11 and the first region 21 in the X-axis direction. The thickness along the X-axis direction of the first insulating region 61 is 2 nm. The thickness along the X-axis direction of the first region 21 is 2 nm. The first insulating region 61 is silicon oxide. On the other hand, in a second model MD-2, the insulating portion 60 of silicon oxide is provided around the first variable resistance portion 11; and the first region 21 and the first insulating region 61 are not provided. In these models, the thermal conductivity of silicon oxide is 1.38 W/mK. The thermal conductivity along the X-axis direction of graphite is taken to be 0.06 W/mK (actual measured value).

FIG. 12A corresponds to the first model MD-1. FIG. 12B corresponds to the second model MD-2. In these figures, the horizontal axis corresponds to a time tm (ns). The vertical axis is a temperature Tp (° C.). In these figures, simulation results of the change of the temperature Tp at three positions are illustrated. At the three positions, the distance ds from the X-axis direction end of the first variable resistance portion 11 is 10 nm, 20 nm, or 100 nm.

It can be seen from FIG. 12A and FIG. 12B that compared to the second model MD-2, the increase of the temperature Tp is slow in the first model MD-1. By providing the first region 21, the increase of the temperature Tp is suppressed at the positions separated from the first variable resistance portion 11. The scattering of the heat of the first variable resistance portion 11 is suppressed. The controllability of the temperature of the first variable resistance portion 11 improves. For example, the effects of heat from the other memory cells are suppressed. For example, the first region 21 functions as a thermal barrier.

Third Embodiment

The embodiment relates to a method for manufacturing a memory device.

FIG. 13A to FIG. 13F are schematic cross-sectional views illustrating the method for manufacturing the memory device according to the third embodiment.

Figure 13A:
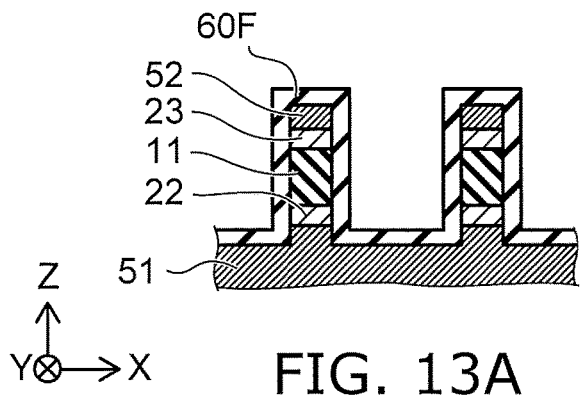
FIG. 13A to FIG. 13F are schematic cross-sectional views illustrating a method for manufacturing the memory device according to the third embodiment.

As shown in FIG. 13A, a stacked film that includes a layer used to form the first electrically conductive portion 51, a layer used to form the second region 22, a layer used to form the first variable resistance portion 11, and a layer used to form the third region 23 is formed; and the stacked film is patterned. The layer that is used to form the second region 22 and the layer that is used to form the third region 23 include, for example, graphene (graphite, etc.). For example, the layer that is used to form the second region 22 and the layer that is used to form the third region 23 can be formed by CVD (chemical vapor deposition), etc. A silicon oxide film is formed as an insulating film 60F on the stacked film after the patterning.

Figure 13B:
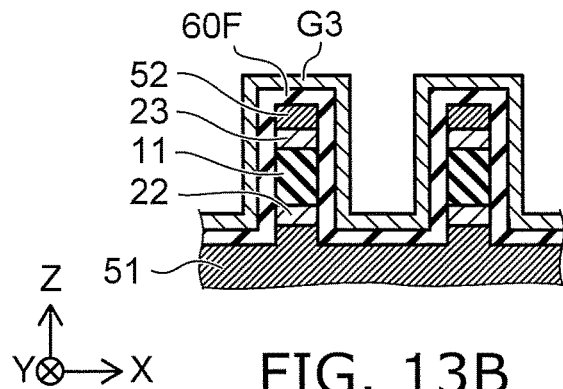

As shown in FIG. 13B, for example, graphene G3 is formed on the upper surface and the side surface of the insulating film 60F. For example, the graphene G3 can be formed by CVD, etc.

Figure 13C:
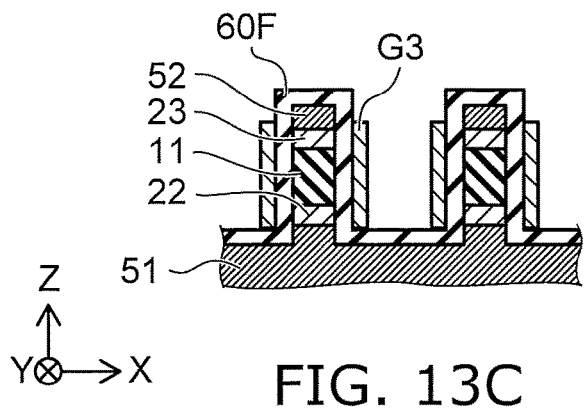

As shown in FIG. 13C, a portion of the graphene G3 is removed. The graphene G3 that is provided on the side surface of the insulating film 60F remains. The remaining graphene G3 is used to form the first region 21.

Figure 13D:
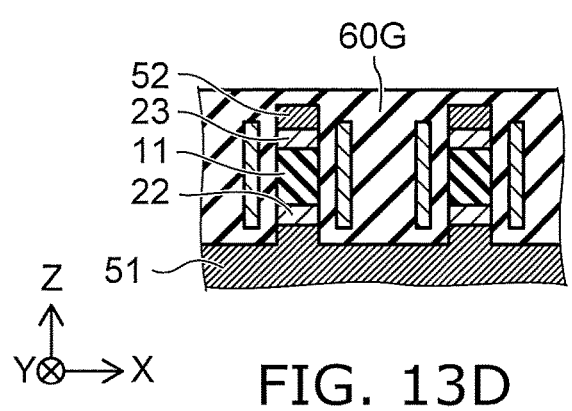

An insulating film 60G is formed as shown in FIG. 13D. For example, the insulating film 60G is used to form an inter-layer insulating film.

Figure 13E:
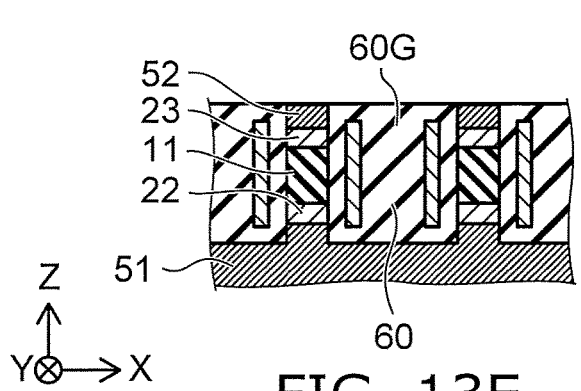

As shown in FIG. 13E, for example, the insulating film 60G is removed by CMP (chemical mechanical polishing), etc.; and the second electrically conductive portion 52 is exposed.

Figure 13F:
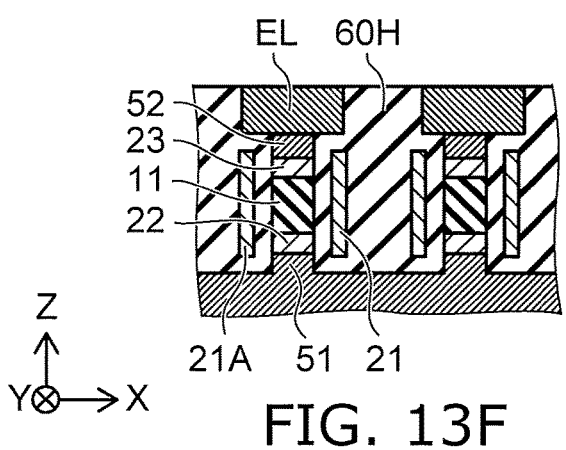

An insulating film 60H and an electrode EL are formed as shown in FIG. 13F. The electrode EL is electrically connected to the second electrically conductive portion 52.

For example, the memory device according to the embodiment can be manufactured using the manufacturing method recited above, etc.

Figure 14A:
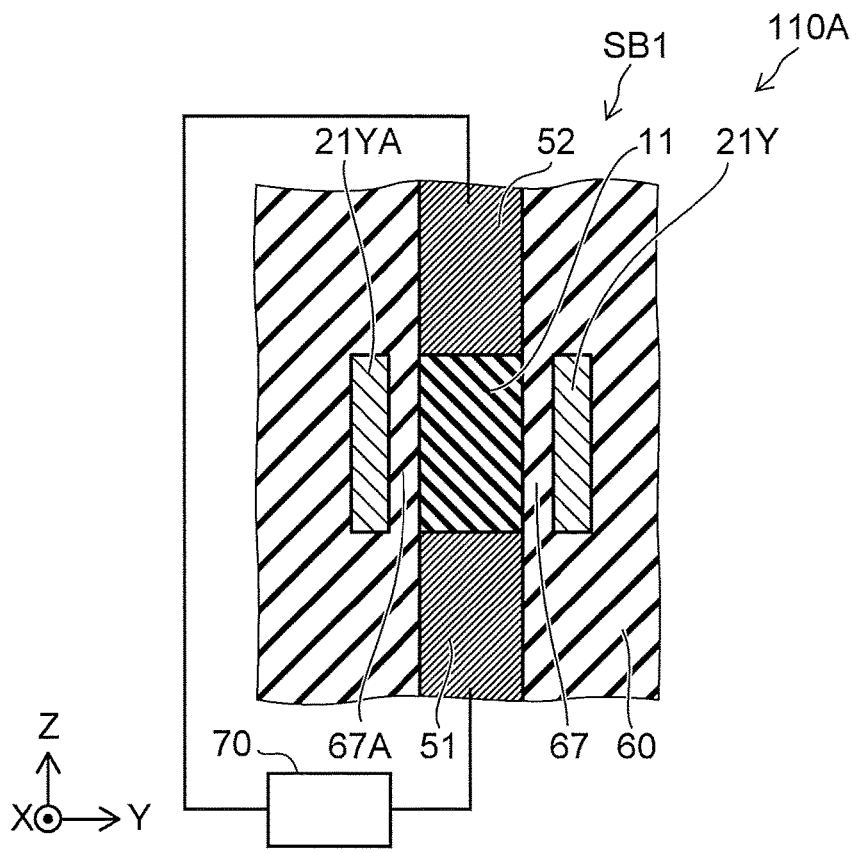
FIG. 14A to FIG. 14C are schematic cross-sectional views illustrating the memory device according to the embodiment.
Figure 14B:
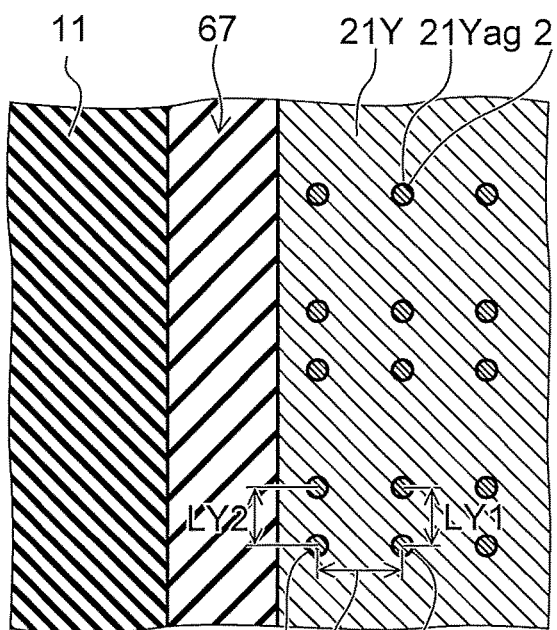
Figure 14C:
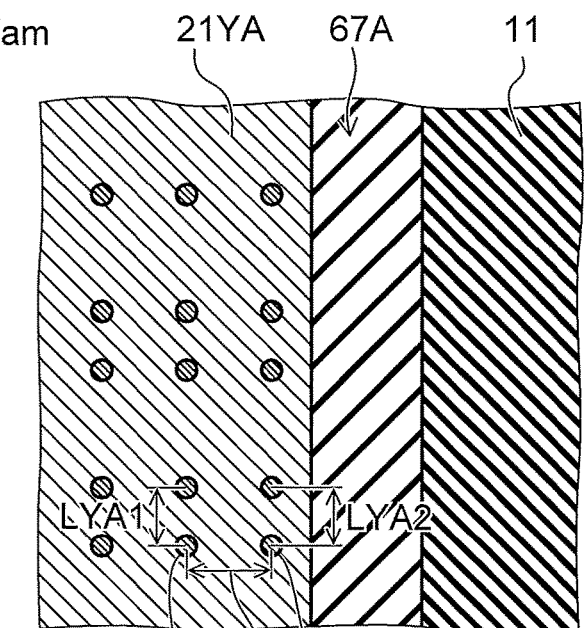

FIG. 14A to FIG. 14C are schematic cross-sectional views illustrating the memory device according to the embodiment.

FIG. 14A to FIG. 14C are cross-sectional views of the memory device 110 described in reference to FIG. 1A to FIG. 1C. The memory device 110 according to the embodiment includes a second region 21Y in addition to the first electrically conductive portion 51, the second electrically conductive portion 52, the first variable resistance portion 11, the first region 21, and the insulating portion 60. The first electrically conductive portion 51, the second electrically conductive portion 52, the first variable resistance portion 11, the first region 21, and the insulating portion 60 may have configurations similar to those of the memory device 110. An example of the second region 21Y will now be described.

The third direction from the first variable resistance portion 11 toward the second region 21Y recited above crosses a plane including the first direction and the second direction. The third direction is, for example, the Y-axis direction. The second region 21Y includes a third layer portion 21Ya and a fourth layer portion 21Yb. The fourth layer portion 21Yb is provided between the third layer portion 21Ya and the first variable resistance portion 11 in the third direction (the Y-axis direction).

The insulating portion 60 includes an insulating region 67. The insulating region 67 is provided between the second region 21Y and the first variable resistance portion 11 in the third direction (the Y-axis direction).

As shown in FIG. 14B, the distance along the third direction between the third layer portion 21Ya and the fourth layer portion 21Yb is taken as a second distance dY1. The lattice length of the third layer portion 21Ya along the third axis direction crossing the third direction (the Y-axis direction) is taken as a third lattice length LY1. The third axis direction is, for example, one direction along the Z-Y plane. The lattice length of the fourth layer portion 21Yb along the fourth axis direction crossing the third direction is taken as a fourth lattice length LY2. The fourth axis direction is, for example, one direction along the Z-Y plane. A third distance dY1 is longer than at least one of the third lattice length LY1 or the fourth lattice length LY2.

For example, a third graphene sheet 21Yag is provided in the third layer portion 21Ya. For example, one graphene sheet corresponds to the third layer portion 21Ya, the fourth layer portion 21Yb, or the like. For example, the third direction (the Y-axis direction) crosses the layer plane of the third graphene sheet 21Yag (in the example of FIG. 14B, the Z-X plane).

The fourth layer portion 21Yb includes multiple atoms 21Yam. The multiple atoms 21Yam are arranged along a plane (e.g., the Z-X plane) crossing the third direction.

In the memory device 110 of the example, the heat of the first variable resistance portion 11 is not conducted easily along the Y-axis direction. For example, the scattering of the heat of the first variable resistance portion 11 can be suppressed. For example, the temperature of the first variable resistance portion 11 can be increased efficiently. For example, the effects of the surrounding temperature on the first variable resistance portion 11 can be suppressed. For example, the uniformity of the temperature along the Z-X plane in the first variable resistance portion 11 increases. The state of the electrical resistance of the first variable resistance portion 11 can be controlled easily. For example, the heat dissipation via the first electrically conductive portion 51 and the second electrically conductive portion 52 during the decrease of the temperature of the first variable resistance portion 11 is suppressed. According to the memory device 110, a memory device can be provided in which the operations can be stable.

In the example, the memory device 110 further includes an opposing region 21YA. As shown in FIG. 14A, the first variable resistance portion 11 is provided between the second region 21Y and the opposing region 21YA in the third direction (e.g., the Y-axis direction). The opposing region 21YA includes an opposing layer portion 21YaA and an opposing layer portion 21YbA. The opposing layer portion 21YbA is provided between the opposing layer portion 21YaA and the first variable resistance portion 11 in the third direction (the Y-axis direction). The insulating portion 60 includes an insulating region 67A.

The insulating region 67A is provided between the opposing region 21YA and the first variable resistance portion 11 in the third direction (the Y-axis direction).

The distance along the third direction between the opposing layer portion 21YaA and the opposing layer portion 21YbA is taken as a distance dYA1. The lattice length of the opposing layer portion 21YaA along an axis direction crossing the third direction (the Y-axis direction) is taken as a lattice length LYA1. The lattice length of the opposing layer portion 21YbA along an axis direction crossing the third direction is taken as a lattice length LYA2. The distance dYA1 is longer than at least one of the lattice length LYA1 or the lattice length LYA2.

In the embodiment, the memory device (e.g., the memory device 110) includes the first electrically conductive portion 51, the second electrically conductive portion 52, the first variable resistance portion 11, the first region 21, and the insulating portion 60 (referring to FIG. 1A). The direction from the first electrically conductive portion 51 toward the second electrically conductive portion 52 is aligned with the first direction. The first variable resistance portion 11 is provided between the first electrically conductive portion 51 and the second electrically conductive portion 52. The second direction from the first variable resistance portion 11 toward the first region 21 crosses the first direction. The first direction is, for example, the Z-axis direction. The second direction is, for example, the X-axis direction. The first region 21 includes the first layer portion 21a (referring to FIG. 1B). The first layer portion 21a includes multiple atoms 21am (referring to FIG. 1B and FIG. 2A). The multiple atoms 21am are arranged along a plane (e.g., the Z-Y plane) crossing the second direction.

For example, the first region 21 includes the first layer portion 21a and the second layer portion 21b. The second layer portion 21b is provided between the first layer portion 21a and the first variable resistance portion 11 in the second direction. The first distance d1 along the second direction between the first layer portion 21a and the second layer portion 21b is longer than at least one of the second distance or the third distance. The second distance is the distance between one of the multiple first atoms (the atoms 21am) included in the first layer portion 21a and another one of the multiple first atoms (the atoms 21am) adjacent to the one of the multiple first atoms (the atoms 21am) recited above in the first direction. For example, the second distance corresponds to the lattice spacing. The third distance is the distance between one of the multiple second atoms (the atoms 21am) included in the second layer portion 21b and another one of the multiple second atoms (the atoms 21am) adjacent to the one of the multiple second atoms (the atoms 21am) recited above in the first direction. For example, the third distance corresponds to the lattice spacing.

The first layer portion 21a includes at least one selected from the group consisting of carbon, molybdenum disulfide, boron nitride, tungsten disulfide, tungsten selenide, molybdenum selenide, and phosphorus.

In the embodiment, the distance along the second direction between the first variable resistance portion 11 and the second variable resistance portion 12 is taken as a distance 11P (referring to FIG. 6 and FIG. 7A). The distance 11P is 200 nm or less, and favorably 30 nm or less.

In the embodiment, the length along the first direction (the Z-axis direction) of the first variable resistance portion 11 is longer than the second length along the second direction (the X-axis direction) of the first variable resistance portion 11. For example, the first length is not less than 1.5 times the second length.

According to the embodiment, a memory device can be provided in which the operations can be stable.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in memory devices such as semiconductor layers, electrically conductive portions, variable resistance portions, regions, insulating portions, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all memory devices practicable by an appropriate design modification by one skilled in the art based on the memory devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device, comprising:
   a first electrically conductive portion;
   a second electrically conductive portion, a direction from the first electrically conductive portion toward the second electrically conductive portion being aligned with a first direction;
   a first variable resistance portion provided between the first electrically conductive portion and the second electrically conductive portion;
   a first region, a second direction from the first variable resistance portion toward the first region crossing the first direction;
   a third electrically conductive portion;
   a fourth electrically conductive portion, a direction from the third electrically conductive portion toward the fourth electrically conductive portion being aligned with the first direction;
   a second variable resistance portion provided between the third electrically conductive portion and the fourth electrically conductive portion;

a fourth region, a direction from the second variable resistance portion toward the fourth region being aligned with the second direction; and
a second opposing region,
the first region including:
  a first layer portion, and
  a second layer portion provided between the first layer portion and the first variable resistance portion in the second direction,
a first distance along the second direction between the first layer portion and the second layer portion being longer than at least one of a first lattice length or a second lattice length, the first lattice length being a lattice length of the first layer portion along a first axis direction crossing the second direction, the second lattice length being a lattice length of the second layer portion along a second axis direction crossing the second direction,
the fourth region including:
  a seventh layer portion, and
  an eighth layer portion provided between the second variable resistance portion and the seventh layer portion in the second direction,
a fourth distance along the second direction between the seventh layer portion and the eighth layer portion being longer than at least one of a seventh lattice length or an eighth lattice length, the seventh lattice length being a lattice length of the seventh layer portion along a seventh axis direction crossing the second direction, the eighth lattice length being a lattice length of the eighth layer portion along an eighth axis direction crossing the second direction,
the second variable resistance portion being provided between the second opposing region and the fourth region in the second direction,
the second opposing region including:
  a third opposing layer portion, and
  a fourth opposing layer portion provided between the third opposing layer portion and the second variable resistance portion in the second direction,
a distance along the second direction between the third opposing layer portion and the fourth opposing layer portion being longer than at least one of a lattice length of the third opposing layer portion along an axis direction crossing the second direction or a lattice length of the fourth opposing layer portion along an axis direction crossing the second direction.

2. The device according to claim 1, further comprising an insulating portion including a first insulating region,
the first insulating region being provided between the first variable resistance portion and the first region in the second direction.

3. The device according to claim 2, further comprising a first opposing region,
the first variable resistance portion being provided between the first opposing region and the first region in the second direction,
the first opposing region including:
  a first opposing layer portion, and
  a second opposing layer portion provided between the first opposing layer portion and the first variable resistance portion in the second direction,
a distance along the second direction between the first opposing layer portion and the second opposing layer portion being longer than at least one of a lattice length of the first opposing layer portion along an axis direction crossing the second direction or a lattice length of the second opposing layer portion along an axis direction crossing the second direction.

4. The device according to claim 3, further comprising an insulating portion,
the insulating portion including:
  a first insulating region provided between the first variable resistance portion and the first region in the second direction; and
  a first opposing insulating region provided between the first variable resistance portion and the first opposing region in the second direction.

5. The device according to claim 1, wherein the first region is provided between the first variable resistance portion and the second variable resistance portion in the second direction.

6. The device according to claim 5, further comprising an insulating portion,
the insulating portion including:
  a first insulating region provided between the first variable resistance portion and the first region in the second direction; and
  an other insulating region provided between the second variable resistance portion and the first region in the second direction.

7. The device according to claim 1, further comprising an insulating portion,
the insulating portion including:
  a first insulating region provided between the first variable resistance portion and the first region in the second direction; and
  a second insulating region provided between the second variable resistance portion and the fourth region in the second direction.

8. The device according to claim 7, further comprising a fifth region provided between the second variable resistance portion and the third electrically conductive portion in the first direction,
the fifth region including:
  a ninth layer portion; and
  a tenth layer portion provided between the ninth layer portion and the second variable resistance portion in the first direction,
a fifth distance along the first direction between the ninth layer portion and the tenth layer portion being longer than at least one of a ninth lattice length or a tenth lattice length, the ninth lattice length being a lattice length of the ninth layer portion along a ninth axis direction crossing the first direction, the tenth lattice length being a lattice length of the tenth layer portion along a tenth axis direction crossing the first direction.

9. The device according to claim 1, further comprising a sixth region provided between the second variable resistance portion and the fourth electrically conductive portion in the first direction,
the sixth region including:
  an eleventh layer portion; and
  a twelfth layer portion provided between the eleventh layer portion and the second variable resistance portion in the first direction,
a sixth distance along the first direction between the eleventh layer portion and the twelfth layer portion being longer than at least one of an eleventh lattice length or a twelfth lattice length, the eleventh lattice length being a lattice length of the eleventh layer portion along an eleventh axis direction crossing the first direction, the twelfth lattice length being a lattice length of the twelfth layer portion along a twelfth axis direction crossing the first direction.

10. The device according to claim 9, wherein the first region includes at least one selected from the group consisting of carbon, molybdenum disulfide, boron nitride, tungsten disulfide, tungsten selenide, molybdenum selenide, and phosphorus.

* * * * *